US012772379B2

(12) United States Patent
Umemura

(10) Patent No.: US 12,772,379 B2
(45) Date of Patent: Oct. 20, 2026

(54) GLASS SUBSTRATE, THROUGH-ELECTRODE, MULTILAYER WIRING SUBSTRATE, AND GLASS SUBSTRATE MANUFACTURING METHOD

(71) Applicant: TOPPAN HOLDINGS INC., Tokyo (JP)

(72) Inventor: Yuki Umemura, Tokyo (JP)

(73) Assignee: TOPPAN HOLDINGS INC., Tokyo (JP)

( * ) Notice: Subject to any disclaimer, the term of this patent is extended or adjusted under 35 U.S.C. 154(b) by 161 days.

(21) Appl. No.: 18/824,153

(22) Filed: Sep. 4, 2024

(65) Prior Publication Data

US 2024/0431027 A1 Dec. 26, 2024

Related U.S. Application Data

(63) Continuation of application No. PCT/JP2023/004603, filed on Feb. 10, 2023.

(30) Foreign Application Priority Data

Mar. 10, 2022 (JP) ................................ 2022-037317

(51) Int. Cl.
*H05K 3/40* (2006.01)
*C03C 15/00* (2006.01)
(Continued)

(52) U.S. Cl.
CPC .............. *H05K 1/115* (2013.01); *C03C 15/00* (2013.01); *C03C 23/0025* (2013.01); *H05K 1/0306* (2013.01); *H05K 3/4038* (2013.01); *H05K 2201/09827* (2013.01); *H05K 2203/107* (2013.01)

(58) Field of Classification Search
CPC ....... H05K 1/0306; H05K 2201/09827; H05K 2201/09854; H05K 3/4038
See application file for complete search history.

(56) References Cited

U.S. PATENT DOCUMENTS

2008/0203420 A1* 8/2008 Higaki .................. H05K 3/403 257/E23.005
2010/0307809 A1* 12/2010 Noda .................. H05K 3/4602 29/829
(Continued)

FOREIGN PATENT DOCUMENTS

JP 2013-102138 A 5/2013
JP 2017-204527 A 11/2017
(Continued)

OTHER PUBLICATIONS

International Searching Authority, "International Search Report," issued in connection with International Patent Application No. PCT/JP2023/004603, dated Apr. 11, 2023.
(Continued)

*Primary Examiner* — Sherman Ng
(74) *Attorney, Agent, or Firm* — Foley & Lardner LLP

(57) ABSTRACT

A glass substrate includes a through hole that penetrates the glass substrate from a first surface to a second surface. The through hole has a minimum bore diameter in the through hole in a section of 1% to 10% from the first surface in a section from the first surface to the second surface.

9 Claims, 17 Drawing Sheets

(51) Int. Cl.
*C03C 23/00* (2006.01)
*H05K 1/03* (2006.01)
*H05K 1/11* (2006.01)

(56) References Cited

U.S. PATENT DOCUMENTS

| | | | |
|---|---|---|---|
| 2017/0358447 A1 | 12/2017 | Tsunetomo et al. | |
| 2018/0068868 A1* | 3/2018 | Jaramillo | C03C 15/00 |
| 2018/0342451 A1* | 11/2018 | Dahlberg | B23K 26/0006 |

FOREIGN PATENT DOCUMENTS

| | | |
|---|---|---|
| JP | 2018-039678 A | 3/2018 |
| WO | WO-2019/235617 A1 | 12/2019 |

OTHER PUBLICATIONS

International Searching Authority, "Written Opinion," issued in connection with International Patent Application No. PCT/JP2023/004603, dated Apr. 11, 2023.
European Extended Search Report issued in corresponding European Patent Application No. 23766420.6 dated Jun. 11, 2025.

* cited by examiner

106b

GLASS SUBSTRATE, THROUGH-ELECTRODE, MULTILAYER WIRING SUBSTRATE, AND GLASS SUBSTRATE MANUFACTURING METHOD

CROSS-REFERENCE TO RELATED PATENT APPLICATIONS

This application is a continuation application filed under 35 U.S.C. § 111 (a) claiming the benefit under 35 U.S.C. §§ 120 and 365 (c) of International Patent Application No. PCT/JP2023/004603, filed on Feb. 10, 2023, which is based upon and claims the benefit to Japanese Patent Application No. 2022-037317, filed on Mar. 10, 2022, the disclosures of all which are incorporated herein by reference in their entirety.

TECHNICAL FIELD

The present invention relates to a glass substrate, a through electrode, a multi-layer wiring substrate, and a method for manufacturing a glass substrate.

BACKGROUND

Background Art

In recent years, electronic devices have become more sophisticated and compact. Accordingly, there have been demands for sophisticating wiring substrates mounted on the electronic devices and increasing the density of the wiring substrates. In particular, glass substrates have more excellent electrical characteristics as wiring substrates than those of silicon or the like and are low in production cost, attracting much attention.

In a case where a glass substrate is used as a wiring substrate, it is necessary to provide the glass substrate with a through hole (TGV: Through Glass Via) and form a through electrode that conducts both sides of the glass substrate. Technology related to such a glass substrate with a through electrode includes the following.

PTL 1 describes a method for manufacturing a through electrode substrate including a substrate and a conductor. The substrate includes a through hole that penetrates the substrate from a first surface to a second surface. The diameter has a local minimum value inside the hole. The conductor is disposed inside the through hole. The through hole satisfies a condition that the value obtained by summing the inclination angles (an angle at which the first surface side is widened is assumed to be a positive inclination angle) of the inner surface of the through hole with respect to the center axis at positions at distances of 6.25%, 18.75%, 31.25%, 43.75%, 56.25%, 68.75%, 81.25%, and 93.75% from the first surface in the section from the first surface to the second surface is greater than or equal to 8.0°.

In addition, in PTL 2, one or more through holes are formed in a glass substrate. A first wiring line on a first surface side of the glass substrate and a second wiring line on a second surface side are conducted via the through holes. A method for manufacturing a glass device is described that includes forming a through hole by etching and thinning a glass substrate after forming a first wiring line, and then forming a wiring line into the through hole and a second wiring line. The thinned glass substrate has a thickness of 50 μm or more and 300 μm or less. The through hole has a frustoconical shape.

Citation List, Patent Literature: PTL 1: JP 2018-39678 A; PTL 2: WO 2019/235617.

SUMMARY OF THE INVENTION

Technical Problem

In a case where wiring layers are formed on a glass substrate and a through electrode that connects them is formed, there is a concern about the influence of thermal stress because the CTE (COEFFICIENT OF THERMAL EXPANSION or thermal expansion coefficient) of the glass and the CTE of Cu or the like that serves as materials for the wiring lines and the through electrode are different. A TCT (Thermal Cycle Test) that is an acceleration test is therefore carried out as one of reliability tests for evaluating the reliability of a device.

The shape of a through hole for increasing the reliability of a through electrode for thermal stress has not been, however, studied sufficiently in the past.

Accordingly, an object of the present invention is to provide a glass substrate, a through electrode, a multi-layer wiring substrate, and a method for manufacturing a glass substrate that each make it possible to increase reliability.

Solution to Problem

To solve the problem described above, one of typical glass substrates according to the present invention includes a through hole that penetrates the glass substrate from a first surface to a second surface. The through hole has a minimum bore diameter in the through hole in a section which is 1% to 10% from the first surface in a section from the first surface to the second surface.

Advantageous Effects of the Invention

According to the present invention, it is possible to provide a glass substrate, a multi-layer wiring substrate, a through electrode, and a method for manufacturing a glass substrate that each make it possible to increase reliability.

A problem, a configuration, and an advantageous effect other than those described above will be clarified from Description of the Embodiments below.

DETAILED DESCRIPTION

Figure 1A:
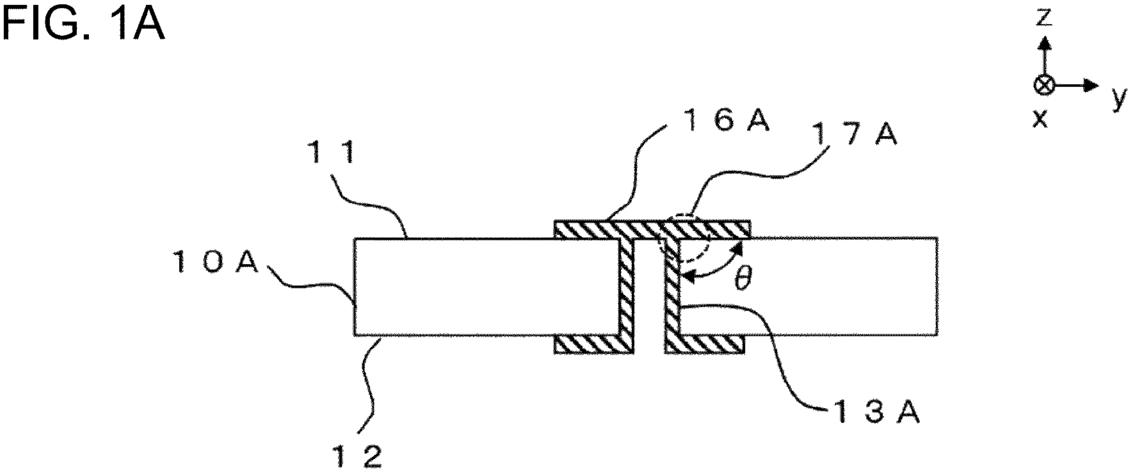
FIGS. 1A and 1B are diagrams schematically illustrating a cross section of a glass substrate according to a conventional example.
Figure 1B:
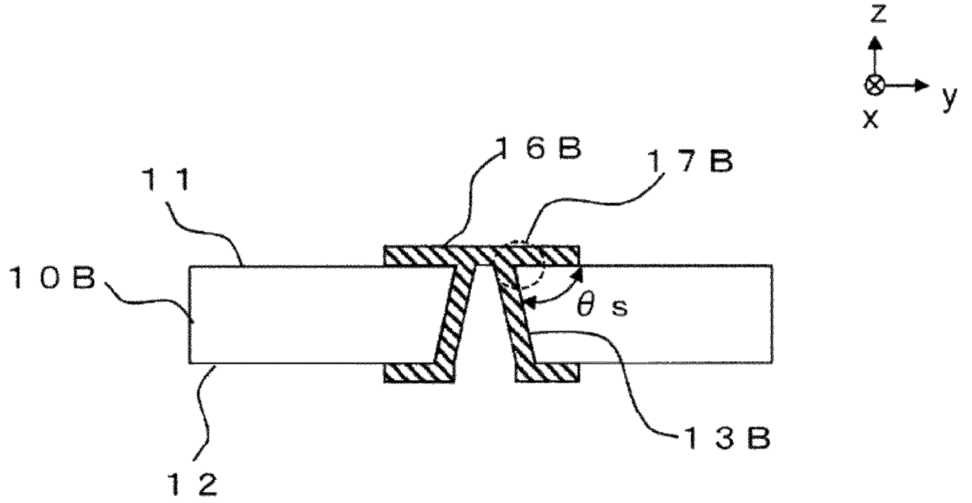

With reference to the drawing, some embodiments of the present invention will be described below. It is to be noted that the present invention is not limited by these embodiments. In addition, the same portion is denoted by the same reference sign in the drawings.

It is to be noted that a "surface" sometimes refers to not only a surface of a plate-shaped member, but also an interface of a layer that is included in the plate-shaped member and is substantially parallel with the surface of the plate-shaped member in the present disclosure. In addition, an "upper surface" or a "lower surface" means a surface illustrated in the upper direction or the lower direction in each of the drawings in a case where a plate-shaped member or a layer included in the plate-shaped member is illustrated. It is to be noted that the "upper surface" and the "lower surface" are also sometimes referred to as a "first surface" and a "second surface".

In addition, a "side surface" means a surface or layer thickness portion of a plate-shaped member or a layer included in the plate-shaped member. Further, a portion of the surface and the side surface are sometimes referred to together as an "end portion".

In addition, an "upper direction" means a vertically upper direction in a case where a plate-shaped member or a layer is horizontally placed. Further, the "upper direction" and a "lower direction" opposite thereto are sometimes referred to as a "Z axis plus direction" and a "Z axis minus direction".

The horizontal direction is sometimes referred to as an "X axis direction" or a "Y axis direction".

Further, distance in the Z axis direction is referred to as "height" and distance in an XY plane defined by the X axis direction and the Y axis direction is referred to as "width".

In addition, a "through electrode provided in a glass substrate" means a conductive path provided to electrically conduct the first surface and the second surface of the glass substrate in a case where the glass substrate is used as a portion of a multi-layer wiring substrate. The glass substrate does not necessarily have to be completely penetrated by a single conductive material. As long as a conductive path from the first surface and a conductive path from the second surface are connected, this is included in the through electrode. Further, the form of the through electrode includes any of a filled form in which the through hole (including any of the forms of a bottomed through hole and a completely penetrating through hole) is filled with a conductive material or a conformal form in which only the sidewall portion of the through hole is covered with a conductive material.

In addition, a "planar shape" and a "plan view" mean shapes obtained in a case where a surface or a layer is visually recognized from the upper direction. Further, a "cross-sectional shape" and a "cross-sectional view" mean shapes visually recognized from the horizontal direction in a case where a plate-shaped member or a layer is cut out in a specific direction.

Further, a "central portion" means a central portion that is not the peripheral portion of a surface or a layer. A "central direction" then means a direction from the peripheral portion of a surface or a layer to the center of the planar shape of the surface or the layer.

Conventional Example

First, with reference to FIG. 1, a conventional example will be described.

Figures 1, 2, 3, 4A, 4B, 4C:
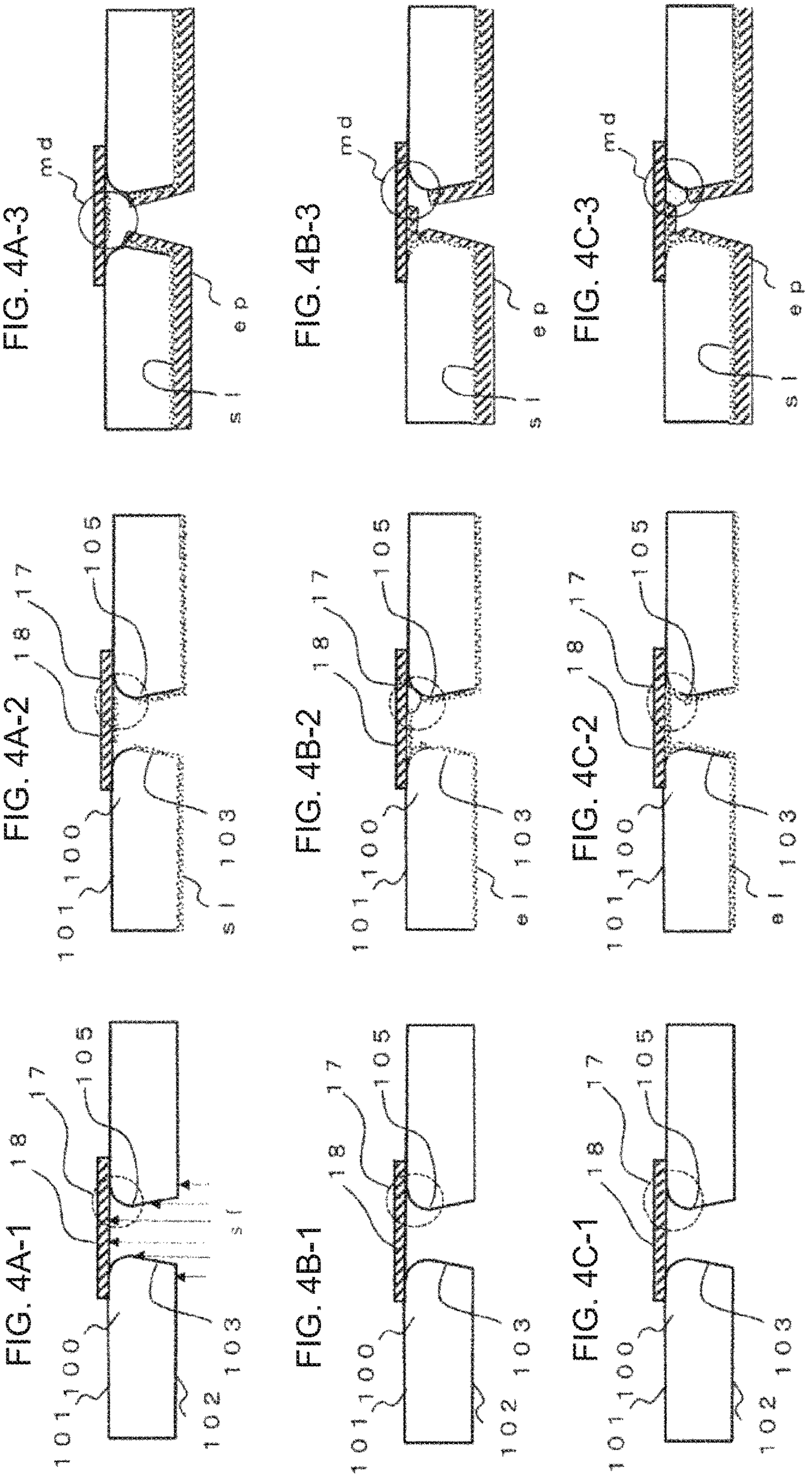
FIGS. 4A-1 to 4A-3, 4B-1 to 4B-3, and 4C-1 to 4C-3 are diagrams schematically illustrating an example of a defect that may be caused in a step of manufacturing the glass substrate according to the first embodiment.

FIG. 1 is a diagram schematically illustrating a cross section of a glass substrate according to the conventional example. FIG. 1(*a*) illustrates an example of the conventional example. A through hole 13A is formed in a glass substrate 10A. The through hole 13A penetrates the glass substrate 10A. Here, a region 17A of the regions between the glass substrate 10A and a through electrode 16A comes into focus. In a case where a thermal cycling test is carried out, stress is generated in the glass substrate 10A because of the occurrence of thermal expansion and thermal shrinkage. In addition, the region 17A is a portion where different materials come into contact with each other. Thermal expansion and thermal shrinkage are thus considered to become greater than in other places.

In addition, FIG. 1(*b*) is another example of the conventional example. FIG. 1(*b*) illustrates a case where a through hole 13B of a glass substrate 10B has a tapered shape in which the through hole 13B opens wider from a first surface 11 to a second surface 12. In this case, an angle θs of the glass substrate 10B in a region 17B of the regions between a through electrode 16B and the glass substrate 10B is an acute angle. It is assumed, for example, that the concentration of generated stress in the region 17B cracks the glass substrate at this time and the crack propagates to the through electrode 16B. In this way, the influence of the stress is considered to grow greater than in the case of FIG. 1. As a result, it may be impossible to secure conduction through the glass substrate 10B.

First Embodiment

With reference to FIGS. 2A and 2B and 3A and 3B, the structure of a glass substrate according to a first embodiment will be described below.

Figure 2A:
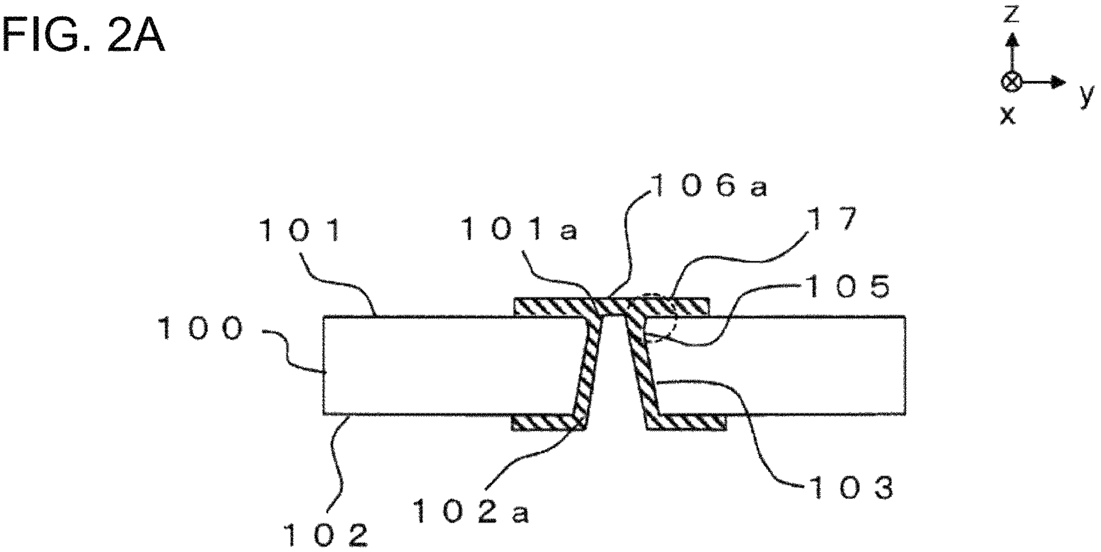
FIGS. 2A and 2B are diagrams schematically illustrating a cross section of a glass substrate according to a first embodiment.
Figure 2B:
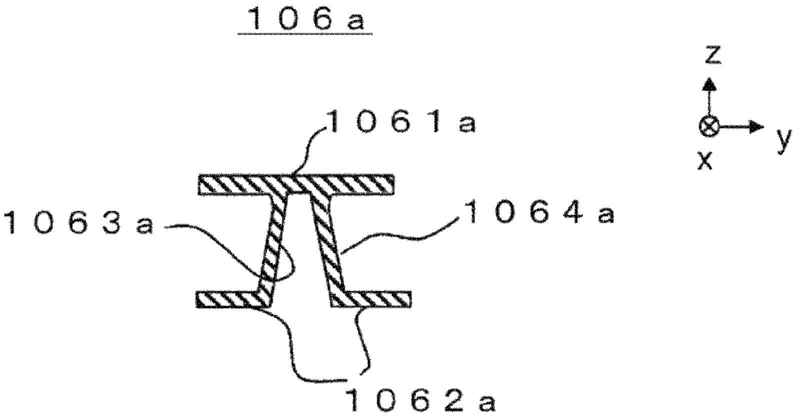

FIGS. 2A and 2B are diagrams schematically illustrating a cross section of the glass substrate according to the first embodiment. FIG. 2A illustrates a cross section of the glass substrate and FIG. 2B illustrates a cross section of a through electrode of the glass substrate.

As illustrated in FIG. 2A, a glass substrate 100 according to the first embodiment includes a through hole 103 that reaches a second surface 102 from a first surface 101. The first surface 101 and the second surface 102 are located at positions at which they are opposed to each other. The through hole 103 reaches the second surface 102 from the first surface 101 through the inside of the glass substrate 100. A through electrode 106*a* is formed in the glass substrate 100. The through electrode 106*a* includes, for example, an electrolytic Cu plating film. It is also possible to use W, Au, Ag, Ti, Ni, Cr, MoNb, or the like as a material in addition to Cu. It is to be noted that FIGS. 2A and 2B omit an adhesive layer and a seed layer.

In addition, as illustrated in FIG. 2B, the through electrode 106*a* according to the first embodiment includes a first-surface-side electrode 1061*a* formed on the first surface 101 of the glass substrate 100, a second-surface-side electrode 1062*a* formed on the second surface 102 of the glass substrate 100, a cavity portion 1063*a* having an opening toward the second surface side of the glass substrate 100, and an electrode outer wall portion 1064*a* that comes into contact with the through hole 103 of the glass substrate 100 and has the same shape as that of the through hole 103. The first-surface-side electrode 1061*a* is the bottom portion of the glass substrate 100.

Figure 3A:
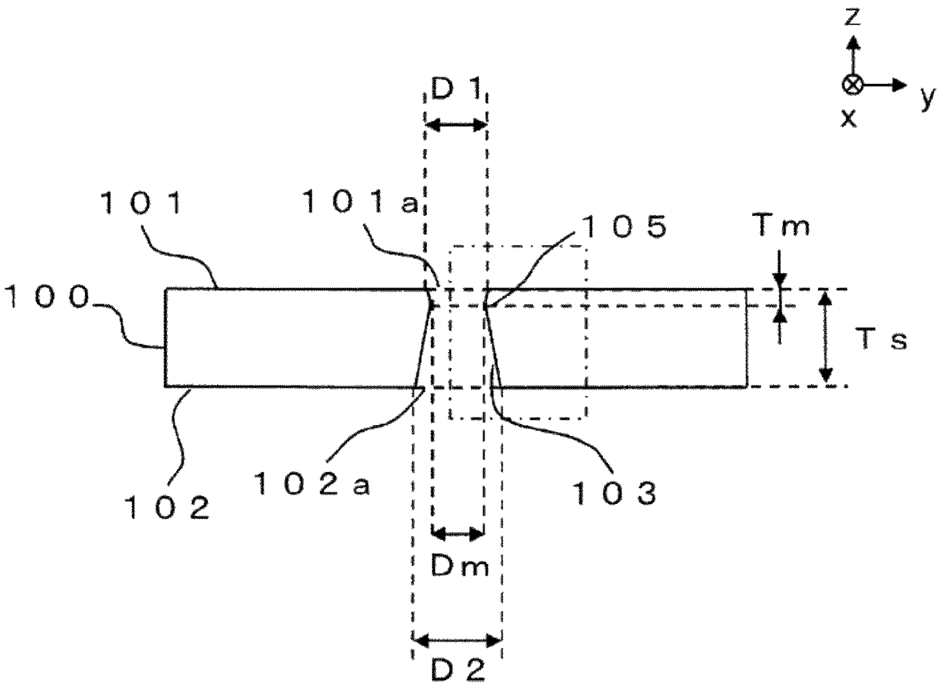
FIGS. 3A and 3B are diagrams schematically illustrating a cross section of the glass substrate according to the first embodiment.
Figure 3B:
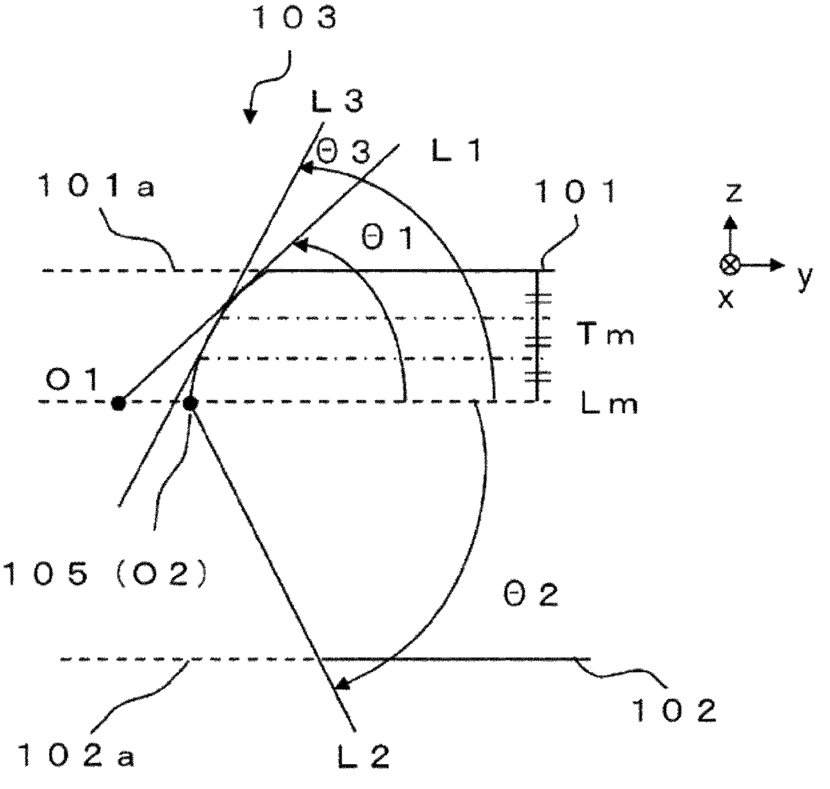

FIGS. 3A and 3B are diagrams schematically illustrating a cross section of the glass substrate according to the first embodiment. FIG. 3A is a diagram illustrating a cross section of the glass substrate with a through electrode omitted and FIG. 3B is an enlarged view of the region surrounded by the dot-dashed line in FIG. 3A.

Here, as illustrated in FIG. 3A, the through hole 103 has a minimum point 105 on the way from the first surface 101 to the second surface 102. The through hole 103 has the minimum diameter at the minimum point 105. The diameter of the through hole at the minimum point is the minimum diameter in the through hole 103. In a plan view, the through hole 103 is, for example, substantially circular. When the diameter of an aperture 101*a* on the first surface 101 is represented as D1, the diameter of an aperture 102*a* on the second surface 102 is represented as D2, and the diameter at the minimum point 105 is represented as Dm, Dm<D1 and Dm<D2 are satisfied. Further, in the first embodiment, D1<D2 is satisfied. The size relationship of Dm<D1<D2 is thus satisfied. It is to be noted that a substantially circular shape is adopted in the first embodiment, but the first embodiment is not limited to the substantially circular shape. For example, in the case of a substantially elliptical shape, D1, D2, and Dm are set in a cross-sectional view of a cross section that passes through the longitudinal axis of the ellipse to satisfy the size relationship described above.

In addition, the minimum point 105 is positioned in a section of 1% to 10% from the first surface in the section from the first surface 101 to the second surface 102. In other words, when the thickness of the glass substrate 100 is represented as Ts in the direction from the first surface 101 to the second surface 102 and the position of the minimum point is represented as Tm, the relationship of Ts/100<Tm<Ts/10 is satisfied. In other words, the through hole 103 has the minimum bore diameter in the through hole 103 in a section of 1% to 10% from the first surface 101 in the section from the first surface 101 to the second surface 102.

FIGS. 4A-4C will be referred to with respect to this and the reason will be described why the relationship of Ts/100<Tm<Ts/10 described above is derived.

FIGS. 4A-4C are diagrams schematically illustrating an example of a defect that may be caused in a step of manufacturing the glass substrate according to the first embodiment. It is to be noted that details of the manufacturing step will be described below.

An example FIGS. 4A-1 to 4A-3 is the case of a dry process and illustrates, in particular, the case of sputtering where a material having high anisotropy is used. FIG. 4A-1 illustrates that vapor deposition particles sf are vapor-deposited for a seed layer. A metal film 18 is formed on the first surface 101 side of the glass substrate 100 as the bottom portion of the through hole 103. FIG. 4A-2 illustrates a case where a seed layer sl is formed. Here, a region 17 of the boundary between the glass substrate and the through hole is a shaded portion that it is difficult for the vapor deposition particles sf to reach and the film formation of a seed layer may be insufficient. As illustrated in FIG. 4A-3, when electroplating is carried out with the insufficient formation of a seed layer, an electroplated film ep is not sufficiently formed and a portion md having defective metallization is generated.

An example FIGS. 4B-1 to 4B-3 illustrates a case where a seed layer is formed by electroless Cu plating. FIG. 4B-1 illustrates the glass substrate 100 that is immersed in a plating solution. A metal film 18 is formed on the first surface 101 side of the glass substrate 100 as the bottom portion of the through hole 103. FIG. 4B-2 illustrates a case where a seed layer sl is formed. Here, the region 17 of the boundary between the glass substrate and the through hole is a portion that is likely to be insufficient in wettability and have air bubbles. The film formation of a seed layer may be insufficient. As illustrated in FIG. 4B-3, when electroplating is carried out with the insufficient formation of a seed layer, the electroplated film ep is not sufficiently formed and the portion md having defective metallization is generated.

An example FIG. 4C-1 to 4C-3 illustrates a case where a seed layer is formed by electroless Cu plating. FIG. 4C-1 illustrates the glass substrate 100 that is immersed in a plating solution. A metal film 18 is formed on the first surface 101 side of the glass substrate 100 as the bottom portion of the through hole 103. FIG. 4C-2 illustrates a case where the seed layer sl is formed. In the case illustrated in FIG. 4C-2, the region 17 of the boundary between the glass substrate and the through hole has sufficient wettability secured and a seed layer is formed. However, when air bubbles occur during the process of electrolytic Cu plating, the growth of the plating is partially prevented and metallization may be partially impossible. FIG. 4C-3 illustrates a case where air bubbles occur during electroplating. In this case, the electroplated film ep is not sufficiently formed and the portion md having defective metallization is generated.

As a result of the studies of the examples FIGS. 4A-1 to 4A-3, 4B-1 to 4B-3, and 4C-1 to 4C-3 described above, in a case where the position Tm of the minimum point 105 is less than Ts/10, the occurrence of phenomena as illustrated in the example FIG. 4A-1 to 4A-3 to the example 4C-1 to 4C-3 is suppressed. In contrast, when the position Tm of the minimum point 105 is less than Ts/100, it is not possible to obtain an effect of increasing the reliability of the glass substrate described below. Therefore, in a case where the thickness of the glass substrate 100 is represented as Ts and the position of the minimum point is represented as Tm, Ts/100<Tm<Ts/10 is preferable.

Next, with reference to FIG. 3B, a method for indicating an inclination angle of the inner wall surface of the through hole 103 will be described. One of methods for indicating an inclination angle of the inner wall surface of the through hole 103 is a method in which the angle of a tangent line of the inner wall surface is used as an inclination angle of the inner wall surface in a cross section including the center axis of the through hole 103. A virtual straight line Lm is then assumed that is parallel with the first surface 101 and passes through the minimum point 105 at which the through hole 103 has the minimum bore diameter in the cross section including the center axis of the through hole 103. A tangent line L1 that comes into contact with a certain point on the inner wall surface is drawn, representing the intersection between the tangent line L1 and the virtual straight line Lm as O1. The tangent line L1 is treated as a line segment originating from the intersection O1. When an angle is measured, the orientation from the virtual straight line in the upper direction (positive z axis direction) is used as positive. The use of this method makes it possible to define an angle θ1 of the tangent line L1 of the inner wall surface of the through hole 103 as being within a range of 0° to 90° in the upper direction of the minimum point 105.

In addition, the same applies to the region in the lower direction of the minimum point 105. A tangent line L2 that comes into contact with the inner wall surface is drawn and the intersection between the tangent line L2 and the virtual straight line Lm is represented as O2. The tangent line L2 is treated as a line segment originating from the intersection O2. It is possible to define an angle θ2 of the tangent line L2 of the inner wall surface of the through hole 103 as being within a range of 0° to −90° or a range of 270° to 360° in the lower direction of the minimum point 105. It is to be noted that FIG. 3B illustrates an example in which the inner wall surface in the lower direction of the minimum point 105 is expressed as a straight line and may be identified with the tangent line L2 of the inner wall surface. In addition, a tangent line may be set in the diagram, but the actual glass substrate is supposed to have irregularities on the inner wall surface.

In such a case, as a method for setting a tangent line on the inner wall surface, for example, it is possible to obtain a regression line by using a least-squares method for any three points set on the inner wall surface and regard the regression line as a contact point. It is to be noted that a cross section including the center axis of the through hole 103 has been defined, but this method is not limitative. It is also possible to define a cross section in the up-down direction (z axis direction) including a plane in which the through hole has the minimum or maximum bore diameter. In addition, as a way to measure an angle, it is also possible to use, as a positive angle, an angle formed counterclockwise from the y axis plus direction of the virtual straight line Lm and use, as a negative angle, an angle formed clockwise.

It is to be noted that, as another method for indicating an inclination angle, it is also possible to divide the distance Tm from the first surface 101 to the virtual straight line Lm and use, as a tangent line, a line connecting the points on the inner wall surface corresponding to the points corresponding to the divided distances. A straight line L3 is a line that passes through the point at which the straight line apart from the first surface 101 in the lower direction by Tm/3 and parallel with the first surface 101 crosses the inner wall surface and the point at which the straight line apart from the first surface 101 in the lower direction by 2Tm/3 and parallel with first surface 101 crosses the inner wall surface. In this way, the distance between the first surface and a plane that is parallel with the first surface and passes through the minimum point may be divided and the line that passes through the point on the inner wall surface corresponding to the divided position may be considered a tangent line to evaluate the inclination angle of the inner wall surface.

Additionally, it is also possible to consider that the through hole 103 has a folded shape. As tangent lines are set for the respective points on the inner wall surface in the up-down direction (z direction), the positive and negative inclinations of the tangent lines change at the minimum point 105. In other words, the minimum point 105 is a point at which a tangent line of the inner wall surface of the through hole 103 is parallel with the Z axis direction, that is, vertical. Such a shape is referred to as a folded shape.

The reason why the three methods described above have been demonstrated is because the actual glass substrate sometimes has fine irregularities left behind on the inner wall surface. Although expressed with an ideally smooth boundary line in the diagram, a tangent line of the actual inner wall surface is difficult to evaluate. The use of any of the methods described above makes it possible to appropriately evaluate an inclination angle of the inner wall surface. It is to be noted that the methods for evaluating an inclination angle of the inner wall surface are not limited to the methods described above.

It is to be noted that the shape of the through electrode 106*a* is the same as the shape of the through hole 103 of the glass substrate 100 and it is thus possible to describe the shape in the same way. For example, it is possible to define the through electrode 106*a* as having the minimum point at which the through electrode 106*a* has the minimum diameter in a section of 1% to 10% from the first-surface-side electrode in the section from the first-surface-side electrode 1061*a* to the second-surface-side electrode 1062*a*.

In addition, it is also possible to use the expression of a folded shape. It is then possible to define the through hole 103 of the glass substrate 100 and the electrode outer wall portion 1064*a* of the through electrode 106*a* each as having a folded shape. In a case where the position is defined, the folded shape is positioned in a section of 1% to 10% from the first surface in the section from the first surface 101 to the second surface 102.

In addition, as illustrated in FIG. 2B, the through electrode has a tapered shape that is wider toward the aperture. For example, it is also possible to define the through electrode 106*a* as having a first tapered shape and a second tapered shape. In the first tapered shape, the bore diameter grows larger from the minimum point 105 to the first-surface-side electrode 1061*a* in a section of 10% from the first surface 101. In the second tapered shape, the bore diameter grows larger from the minimum point to the aperture of the second surface 102. Alternatively, it is also possible to define the through electrode 106*a* as having a first tapered shape and a second tapered shape. In the first tapered shape, the bore diameter grows larger from the minimum point to the first-surface-side electrode 1061*a* in a section of 10% from the first-surface-side electrode 1061*a*. In the second tapered shape, the bore diameter grows larger from the minimum point to the aperture of the second-surface-side electrode 1062*a*.

Second Embodiment

Figure 5A:
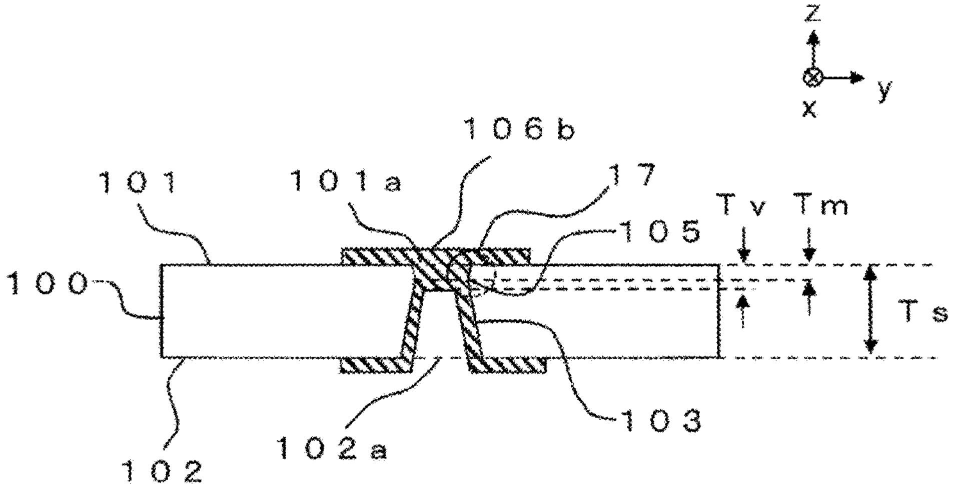
FIGS. 5A and 5B are diagrams schematically illustrating a cross section of a glass substrate according to a second embodiment.
Figure 5B:
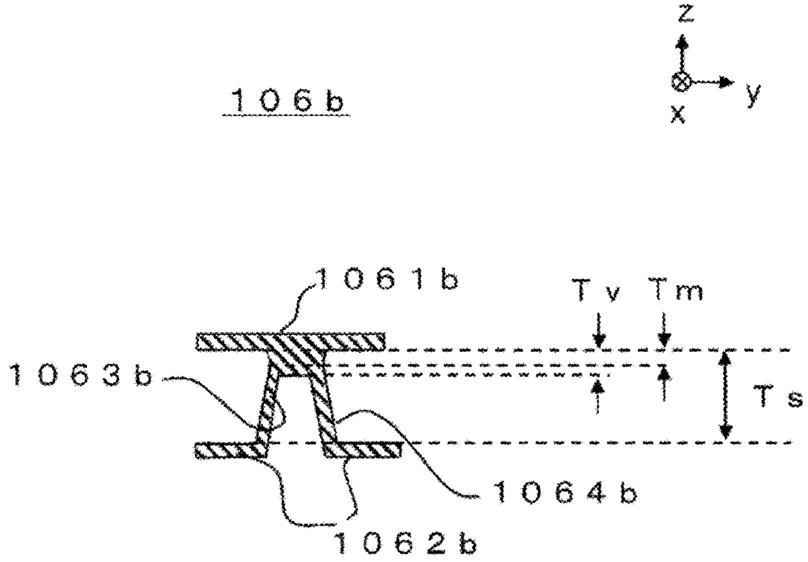

It is possible to adopt a variety of shapes as the shape of a through electrode formed in a glass substrate. With reference to FIGS. 5A and 5B, the structure of a glass substrate according to a second embodiment will be described below. The second embodiment is different from the first embodiment in that the through electrode has a different shape.

FIGS. 5A and 5B are diagrams schematically illustrating a cross section of the glass substrate according to the second embodiment. FIG. 5A illustrates a cross section of the glass substrate and FIG. 5B illustrates a cross section of a through electrode of the glass substrate.

As illustrated in FIG. 5A, the glass substrate 100 according to the first embodiment includes the through hole 103 that reaches the second surface 102 from the first surface 101. The first surface 101 and the second surface 102 are located at positions at which they are opposed to each other. The through hole 103 reaches the second surface 102 from the first surface 101 through the inside of the glass substrate 100. A through electrode 106*b* is formed in the glass substrate 100. The through electrode 106*a* includes, for example, an electrolytic Cu plating film. It is also possible to use W, Au, Ag, Ti, Ni, Cr, MoNb, or the like as a material in addition to Cu. It is to be noted that FIGS. 5A and 5B omit an adhesive layer and a seed layer.

In addition, as illustrated in FIG. 5B, a through electrode 106*b* according to the second embodiment includes a first-surface-side electrode 1061*a* formed on the first surface 101 of the glass substrate 100, a second-surface-side electrode 1062*b* formed on the second surface 102 of the glass substrate 100, a cavity portion 1063*b* having an opening toward the second surface side of the glass substrate 100, and an electrode outer wall portion 1064*b* that comes into contact with the through hole 103 of the glass substrate 100 and has the same shape as that of the through hole 103. The first-surface-side electrode 1061*a* is the bottom portion of the glass substrate 100.

As illustrated in FIGS. 5A and 5B, the inside of the cavity portion 1063*b* of the through electrode 106*b* is filled with a conductive member. In the second embodiment, a position Tv of the boundary surface of the filling substance is a position closer to the second surface 102 than the position Tm of the minimum point 105. Additionally, it is possible to achieve such a structure by controlling the thickness of the bottom portion with the adjustment of a plating additive, the adjustment of electric currents to be applied, and the adjustment of the jet flow rate. An example method is increasing the content ratio of accelerators included in the plating solution. Depending on an additive to be used, the amount of electric current to be applied makes it possible to selectively increase the plating thickness of the bottom portion of the through hole in accordance with an electric-current condition as compared with the plating thickness of the surface.

Third Embodiment

Figure 6A:
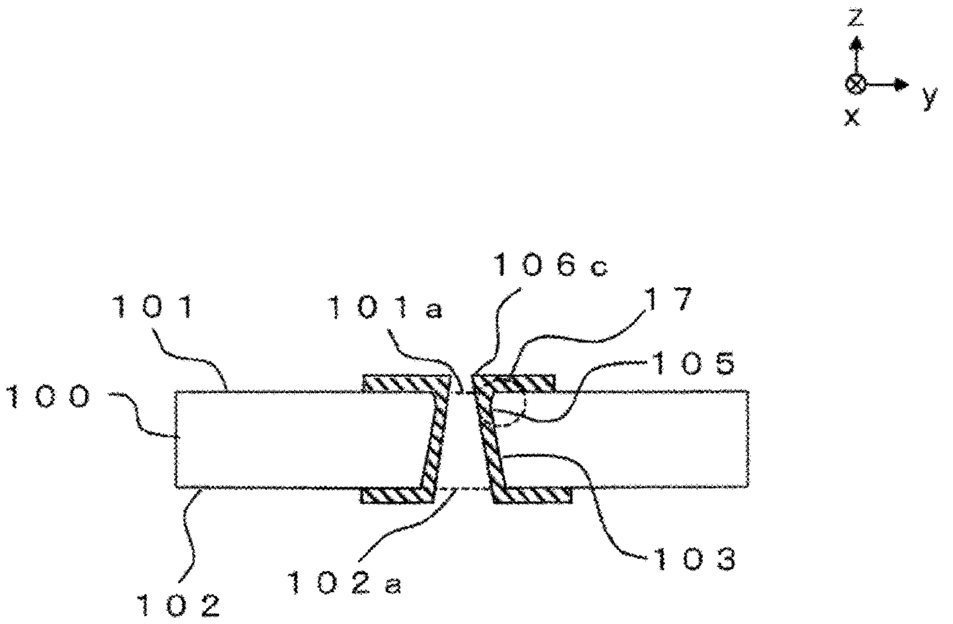
FIGS. 6A and 6B are diagrams schematically illustrating a cross section of a glass substrate according to a third embodiment.
Figure 6B:
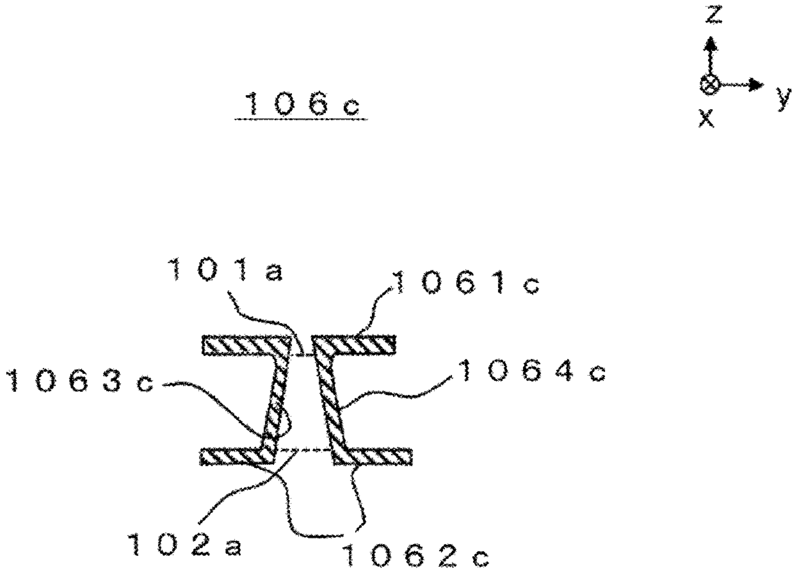

With reference to FIGS. 6A and 6B, the structure of a glass substrate according to a third embodiment will be described below. The third embodiment is different from the first embodiment and the second embodiment in that a through electrode has a different shape.

FIGS. 6A and 6B are diagrams schematically illustrating a cross section of the glass substrate according to the third embodiment. FIG. 6A illustrates a cross section of the glass substrate and FIG. 6B illustrates a cross section of a through electrode of the glass substrate.

As illustrated in FIG. 6A, the glass substrate 100 according to the first embodiment includes the through hole 103 that reaches the second surface 102 from the first surface 101. The first surface 101 and the second surface 102 are located at positions at which they are opposed to each other. The through hole 103 reaches the second surface 102 from the first surface 101 through the inside of the glass substrate 100. A through electrode 106*c* is formed in the glass substrate 100. The through electrode 106*c* includes, for example, an electrolytic Cu plating film. It is also possible to use W, Au, Ag, Ti, Ni, Cr, MoNb, or the like as a material in addition to Cu. It is to be noted that FIGS. 6A and 6B omits an adhesive layer and a seed layer.

In addition, as illustrated in FIG. 6B, the through electrode 106*c* according to the third embodiment includes a first-surface-side electrode 1061*c* formed on the first surface 101 of the glass substrate 100, a second-surface-side electrode 1062*c* formed on the second surface 102 of the glass substrate 100, a cavity portion 1063*c* having an opening toward the second surface side of the glass substrate 100, and an electrode outer wall portion 1064*c* that comes into contact with the through hole 103 of the glass substrate 100 and has the same shape as that of the through hole 103.

Here, in the third embodiment, the through electrode 106*c* has a gap at the aperture 101*a* on the first surface 101 side of the glass substrate 100.

Fourth Embodiment

With reference to FIGS. 7A, 7B, 8, 9A, and 9B, a fourth embodiment will be described below. The fourth embodiment is different from the first embodiment to the third embodiment in that a chamfered shape 330 is formed at the through hole 103.

Figure 7A:
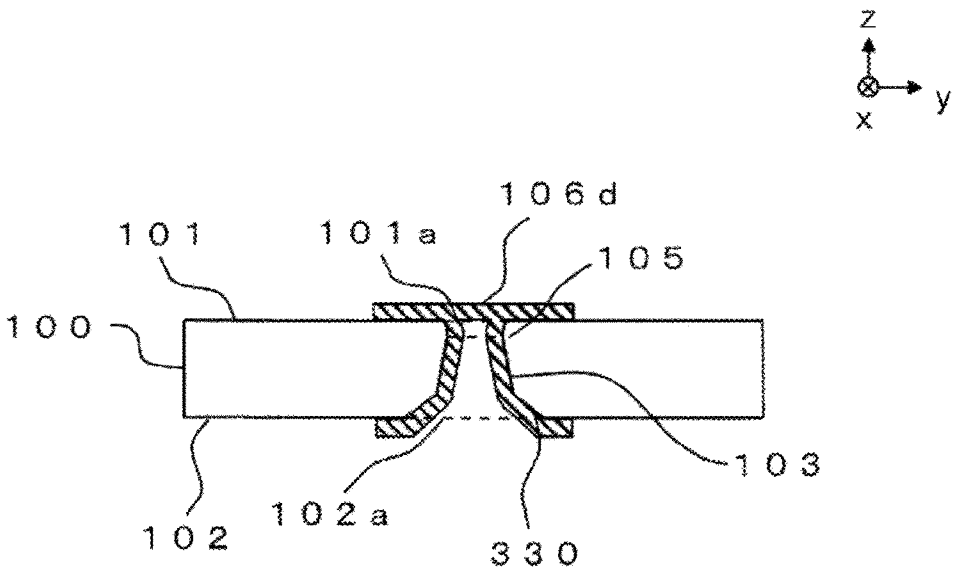
FIGS. 7A and 7B are diagrams schematically illustrating a cross section of a glass substrate according to a fourth embodiment.
Figure 7A:
Figure 7B:
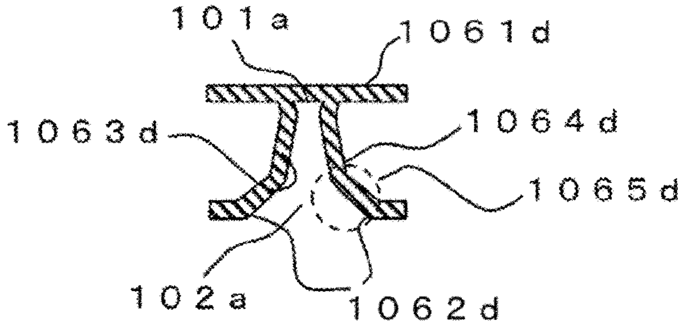

FIGS. 7A and 7B are diagrams schematically illustrating a cross section of the glass substrate according to the fourth embodiment. FIG. 7A illustrates a cross section of the glass substrate and FIG. 7B illustrates a cross section of a through electrode of the glass substrate.

As illustrated in FIG. 7A, the glass substrate 100 according to the fourth embodiment includes the through hole 103 that reaches the second surface 102 from the first surface 101. The first surface 101 and the second surface 102 are located at positions at which they are opposed to each other. The through hole 103 reaches the second surface 102 from the first surface 101 through the inside of the glass substrate 100. A through electrode 106*d* formed in the glass substrate 100 includes, for example, an electrolytic Cu plating film. It is also possible to use W, Au, Ag, or the like as a material in addition to Cu. It is to be noted that FIGS. 7A and 7B omit an adhesive layer and a seed layer.

In addition, as illustrated in FIG. 7B, the through electrode 106*d* according to the fourth embodiment includes a first-surface-side electrode 1061*d* formed on the first surface 101 of the glass substrate 100, a second-surface-side electrode 1062*d* formed on the second surface 102 of the glass substrate 100, a cavity portion 1063*d* having an opening toward the second surface side of the glass substrate 100, and an electrode outer wall portion 1064*d* that comes into contact with the through hole 103 of the glass substrate 100 and has the same shape as that of the through hole 103. The first-surface-side electrode 1061*d* is the bottom portion of the glass substrate 100.

As illustrated in FIG. 7A, the through hole 103 of the glass substrate 100 has the chamfered shape 330 between the second surface 102 of the glass substrate and the through hole 103. In addition, as illustrated in FIG. 7B, a chamfered shape 1065*d* that is a shape conforming to the chamfered shape 330 is also formed at the through electrode 106*d*. When the chamfered shape is compared with the case of the first embodiment, a ridge line is formed between the second surface 102 and the through hole 103 in the first embodiment, for example, as illustrated in FIG. 2 (*a*). Meanwhile, a chamfered shape is formed between the second surface 102 and the through hole 103 in the fourth embodiment.

Figure 8:
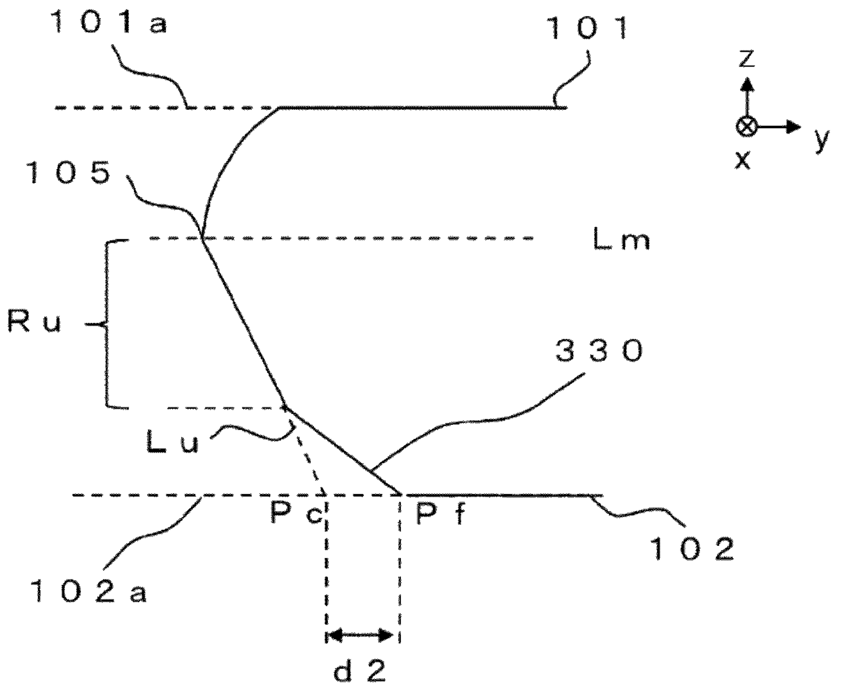
FIG. 8 is a schematic enlarged view of a chamfered shape of the glass substrate according to the fourth embodiment.

FIG. 8 is a schematic enlarged view of the chamfered shape 330 of the glass substrate 100 according to the fourth embodiment. The minimum point 105 of the through hole 103 is the point at which the virtual line Lm and the through hole 103 intersect each other. The point at which a tangent line Lu of a region Ru between the minimum point 105 and the inner wall surface up to the chamfered shape 330 and the aperture 102*a* of the second surface 102 cross each other is referred to as a crossing point Pc. In addition, the point at which the chamfered shape 330 reaches the second surface 102 is referred to as a terminal point Pf. The length between the crossing point Pc and the terminal point Pf is represented as d2. Here, d2 is greater than or equal to 1 um and less than or equal to 20 μm. Further, d2 may be greater than or equal to 5 μm and less than or equal to 10 μm. One of the reasons why this range is adopted is because this range prevents a product in which the glass substrate is incorporated from having too large a size or prevents the glass substrate from having too long a processing time.

Figure 9A:
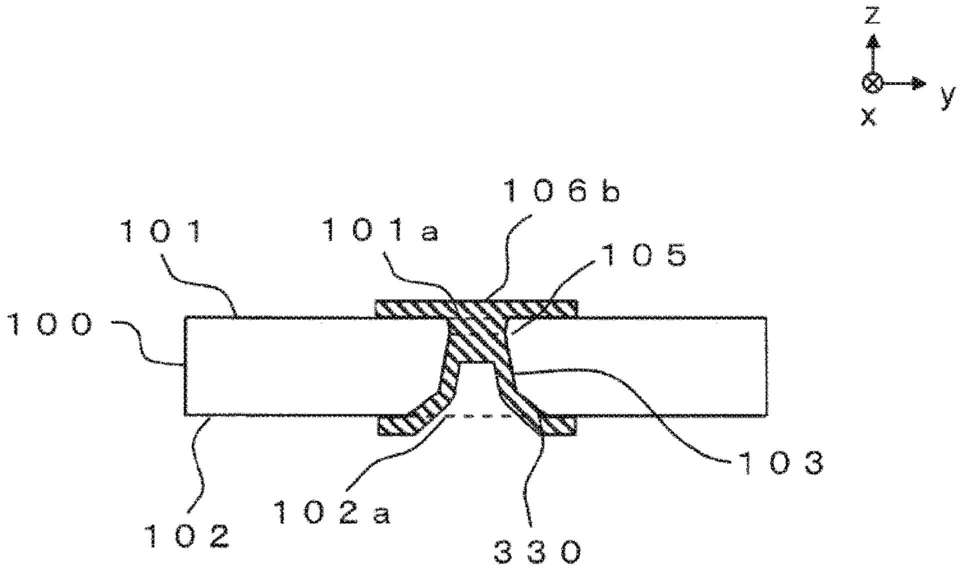
FIGS. 9A and 9B are diagrams schematically illustrating the cross section of the glass substrate according to the fourth embodiment.
Figure 9B:
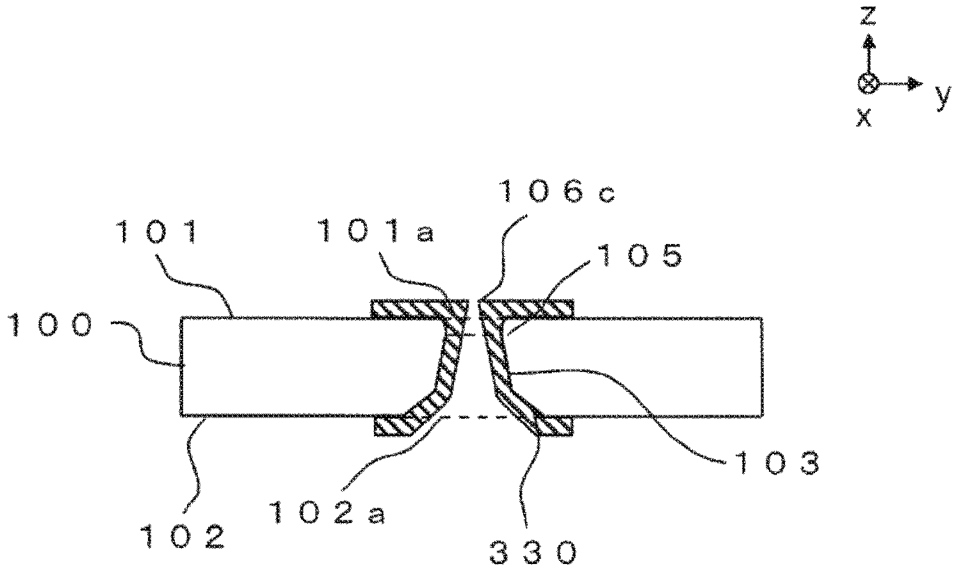

FIGS. 9A and 9B are diagrams schematically illustrating a cross section of the glass substrate according to the fourth embodiment. The through electrode of the glass substrate according to the fourth embodiment is not limited to the through electrode illustrated in FIGS. 7A and 7B. FIG. 9A is a diagram illustrating that the through electrode 106*b* according to the second embodiment is formed in the glass substrate according to the fourth embodiment. FIG. 9B is a diagram illustrating that the through electrode 106*c* according to the third embodiment is formed in the glass substrate according to the fourth embodiment. In this way, it is possible to change the shape of the through electrode depending on purpose or application.

Additionally, it is possible to manufacture the glass substrate 100 according to the fourth embodiment by using a manufacturing method described below. It is possible to manufacture a glass substrate 300 and a multi-layer wiring substrate including the glass substrate 300 by selecting etching conditions in a step 9, for example, the concentration of a solvent to be used, the exposure time, a method such as spraying or dipping, and the like.

Functions and Effects

In each of the first embodiment to the fourth embodiment, the minimum point is provided on the inner wall portion of the through hole of the glass substrate. In the region 17 of the boundary between the glass substrate and the through hole, the shape of the glass substrate from the first surface 101 to the minimum point 105 is smoother than the shape of the conventional example. In other words, no ridge line is formed in the glass substrate 100 in the region 17. Even in a case where the glass substrate according to any of the first embodiment to the third embodiment is subjected to a thermal cycling test, such a shape releases the concentration of stress on the glass substrate. The reliability of the glass substrate is thus guaranteed in a case where a thermal cycling test is carried out.

It is to be noted that an angle θ3 in FIG. 3B preferably ranges from 20° to 90° to obtain an effect of releasing stress more and achieve favorable metallization. This is because a dry-etching process generates a shaded portion that is difficult for a sputtering species to reach depending on the shape of the minimum point in seed formation by sputtering, which results in anisotropic film formation, and does not result in the favorable film formation of the shaded portion. Power supply may be therefore prevented in subsequent electrolytic Cu plating.

In addition, in a case where a through electrode is filled with a conductive member like the through electrode 106*a* according to the second embodiment as illustrated in FIGS. 5A and 5B, it is possible to extend the time before the through electrode is broken in spite of a crack occurring in the through electrode. This results in increased reliability.

In addition, the conventional through hole 103 does not have the chamfered shape 330. This causes risks that the glass substrate has a crack in a thermal cycling test and the through electrode is broken. As illustrated in FIGS. 7A and 7B, the chamfered shape 330 is provided in the fourth embodiment. This makes it possible to prevent stress from concentrating on the portion of the chamfered shape 330 and suppress the occurrence of defects.

Fifth Embodiment

With reference to FIGS. 10 to 18, a glass substrate, a through electrode, a multi-layer wiring substrate, and a method for manufacturing a glass substrate according to a fifth embodiment will be described below. As described in each of the first embodiment to the fourth embodiment, the state in which the through hole and the through electrode are formed will be referred to as a glass substrate and the state in which the wiring layer is formed on any one of the first surface or the second surface of the glass substrate will be referred to as a multi-layer wiring substrate for the sake of convenience.

Step 1

Figure 10:
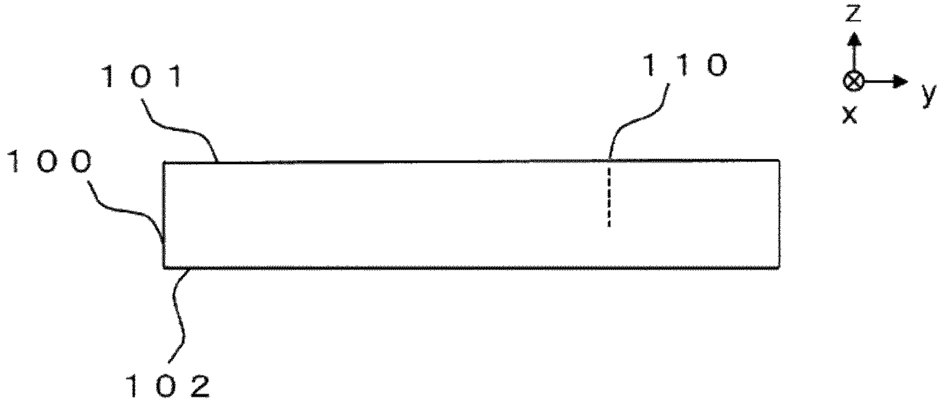
FIG. 10 is a diagram illustrating a step 1 of a manufacturing method according to a fifth embodiment.

FIG. 10 is a diagram illustrating a step 1 of a manufacturing method according to the fifth embodiment. In the step 1, the glass substrate 100 is prepared and a laser modified portion is generated. The substrate used in the first embodiment is an alkali-free glass (EN-A1) manufactured by AGC Inc. and has a thickness of 500 μm.

First, ultrasonic cleaning or the like is carried out to remove a contaminant on a surface of the glass substrate. Subsequently, the glass substrate is irradiated with a laser beam from the first surface 101 side to form a laser modified portion 110 from which a through hole originates. The laser modified portion is formed to extend into the glass substrate 100 in the vertical direction from the first surface and have the lower end of the laser modified portion remain in the glass substrate.

Step 2

Figure 11:
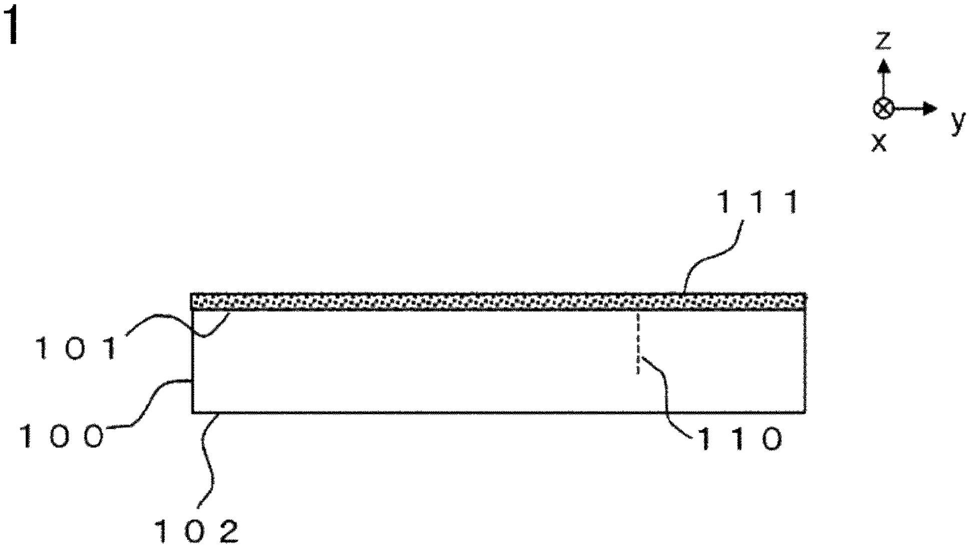
FIG. 11 is a diagram illustrating a step 2 of the manufacturing method according to the fifth embodiment.

FIG. 11 is a diagram illustrating a step 2 of the manufacturing method according to the fifth embodiment. In the step 2, a hydrofluoric acid resistant metal film and a seed layer 111 are formed on the first surface 101 of the glass substrate 100.

First, a hydrofluoric acid resistant metal film (not illustrated) is formed on the first surface 101 of the glass substrate 100. The film thickness is, for example, greater than or equal to 10 nm and less than or equal to 500 nm. Subsequently, a copper coating is formed on the hydrofluoric acid resistant metal film. The film thickness is, for example, greater than or equal to 100 nm and less than or equal to 500 nm. A sputtering method or an electroless plating method is then applied. This forms the seed layer 111 on the first surface 101 of the glass substrate 100. It is possible to select a material for the hydrofluoric acid resistant metal film as appropriate from, for example, chromium, nickel, and nickel-chromium.

Step 3

Figure 12:
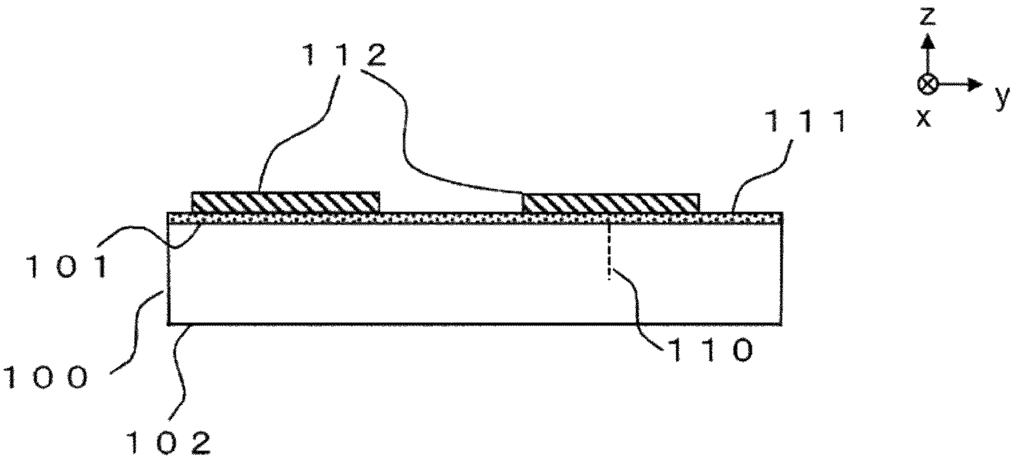
FIG. 12 is a diagram illustrating a step 3 of the manufacturing method according to the fifth embodiment.

FIG. 12 is a diagram illustrating a step 3 of the manufacturing method according to the fifth embodiment. In the step 3, a photoresist having a pattern is formed on the seed layer 111. In the example of the first embodiment, a dry photoresist (RD1225) manufactured by Showa Denko Materials Co., Ltd. is used. First, the dry photoresist is laminated onto the first surface 101 side. In other words, the dry photoresist is bonded to the seed layer 111 in a thermocompression manner. Subsequently, a pattern is drawn on the dry photoresist and the dry photoresist is developed to expose the seed layer 111. The seed layer 111 is supplied with power and electrolytic copper plating is carried out to form a lower electrode 112. The thickness of the electrolytic copper plating is, for example, greater than or equal to 2 μm and less than or equal to 10 μm. After the plating, a dry film resist that is no longer necessary is dissolved away.

Step 4

Figure 13:
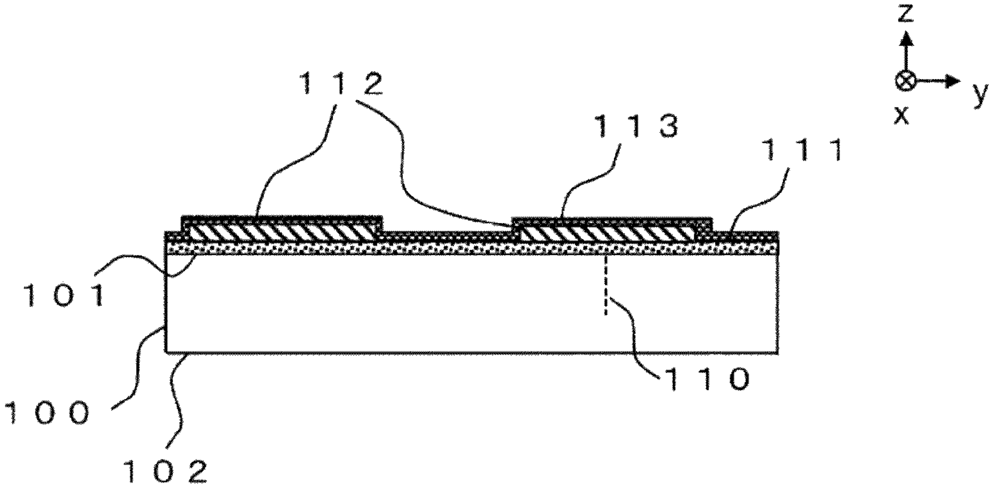
FIG. 13 is a diagram illustrating a step 4 of the manufacturing method according to the fifth embodiment.

FIG. 13 is a diagram illustrating a step 4 of the manufacturing method according to the fifth embodiment. In the step 4, a dielectric film 113 is formed on the first surface 101 side. For example, SiN, $SiO_2$, $TaO_x$, or the like is formed by plasma CVD.

Step 5

Figure 14:
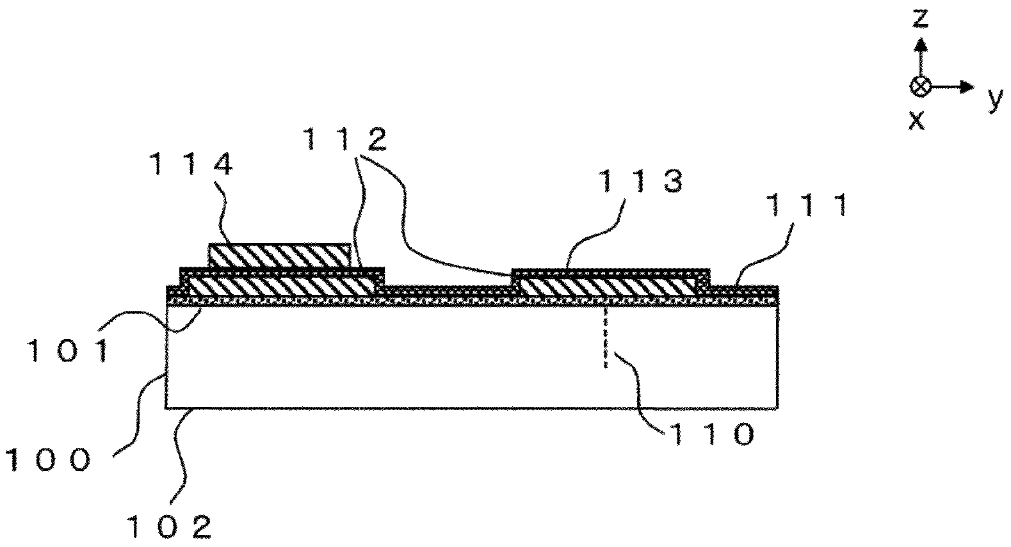
FIG. 14 is a diagram illustrating a step 5 of the manufacturing method according to the fifth embodiment.

FIG. 14 is a diagram illustrating a step 5 of the manufacturing method according to the fifth embodiment. In the step 5, an upper electrode 114 is formed on the first surface 101 side.

First, a copper coating or the like is formed on the dielectric film 113 in a sputtering method, an electroless plating method, and the like as an upper-electrode seed layer (not illustrated). A material for the copper coating is Cu or Ti/Cu (titanium copper alloy). The thickness of the copper coating ranges, for example, from 100 nm or more to 500 nm or less. Subsequently, a dry photoresist is laminated onto the first surface 101 side, a pattern is drawn, and the dry photoresist is developed. This exposes the upper-electrode seed layer. Finally, the upper-electrode seed layer is supplied with power and electrolytic copper plating of a thickness of 2 μm or more and 10 μm or less is carried out to form the upper electrode 114.

Step 6

Figure 15:
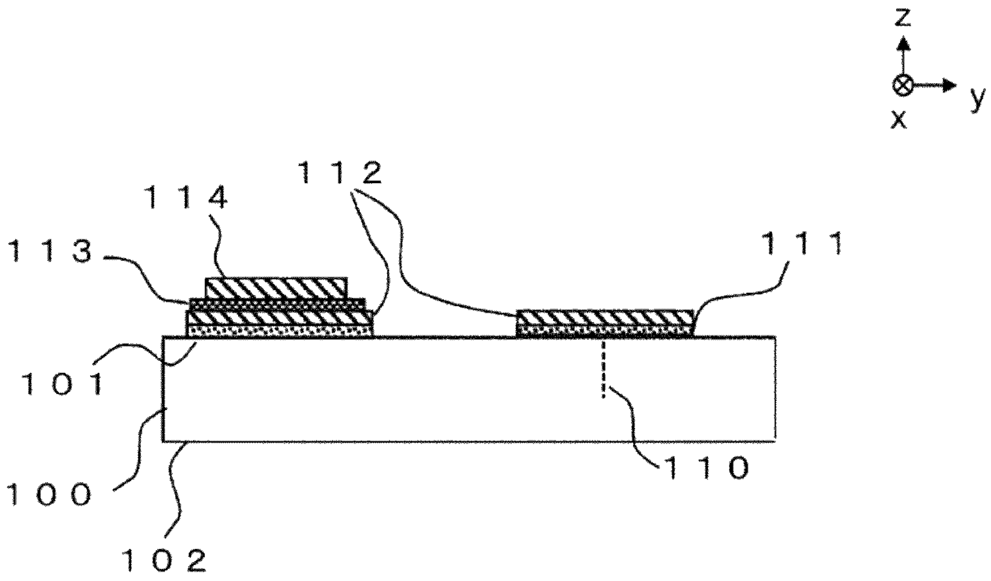
FIG. 15 is a diagram illustrating a step 6 of the manufacturing method according to the fifth embodiment.

FIG. 15 is a diagram illustrating a step 6 of the manufacturing method according to the fifth embodiment. In the step 6, the seed layer of the upper electrode 114, the dielectric film 113, the seed layer 111 of the lower electrode, and the hydrofluoric acid resistant metal film are etched. The dielectric film 113 in the lower direction of the upper electrode 114 is then left behind. Additionally, it is possible to select an etching method as appropriate. For example, it is possible to apply wet etching to the Cu member of the seed layer, dry etching to the dielectric film 113, and any of dry etching and wet etching to Ti. It is also possible to subject the hydrofluoric acid resistant metal film to an etching process by using an etchant corresponding to the member of the metal film.

Step 7

Figure 16:
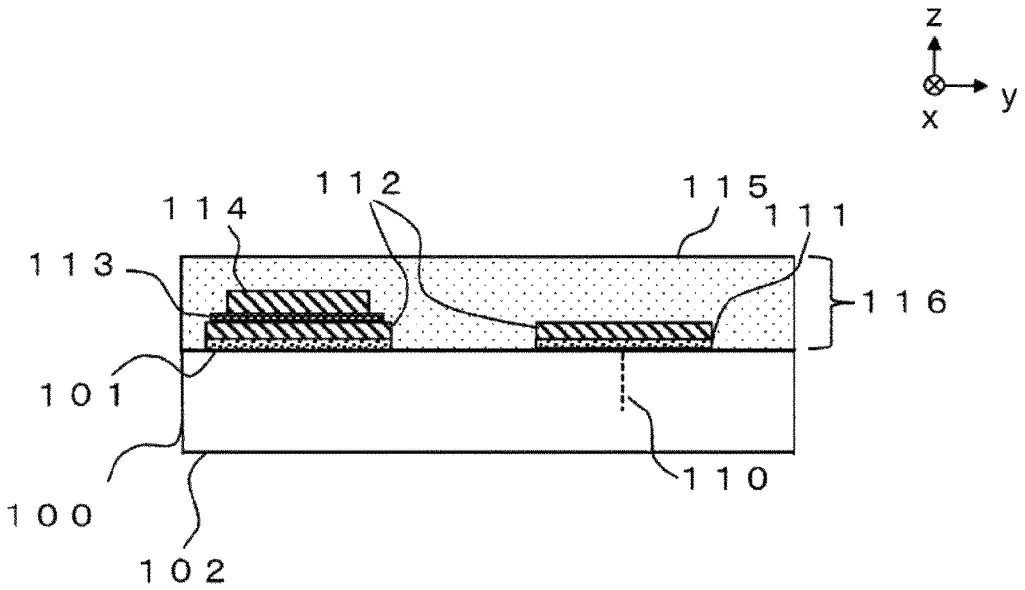
FIG. 16 is a diagram illustrating a step 7 of the manufacturing method according to the fifth embodiment.

FIG. 16 is a diagram illustrating a step 7 of the manufacturing method according to the fifth embodiment. In the step 7, an insulating resin 115 is laminated onto the glass substrate 100. In the example of the first embodiment, an insulating resin (ABF-GL103 having a thickness of 32.5 μm) manufactured by Ajinomoto Fine-Techno Co., Inc. is used. Here, a layer including the seed layer 111, the lower electrode 112, the dielectric film 113, the upper electrode 114, and the insulating resin 115 formed on the first surface 101 is referred to as a first-surface wiring layer 116 for the sake of convenience.

Step 8

Figure 17:
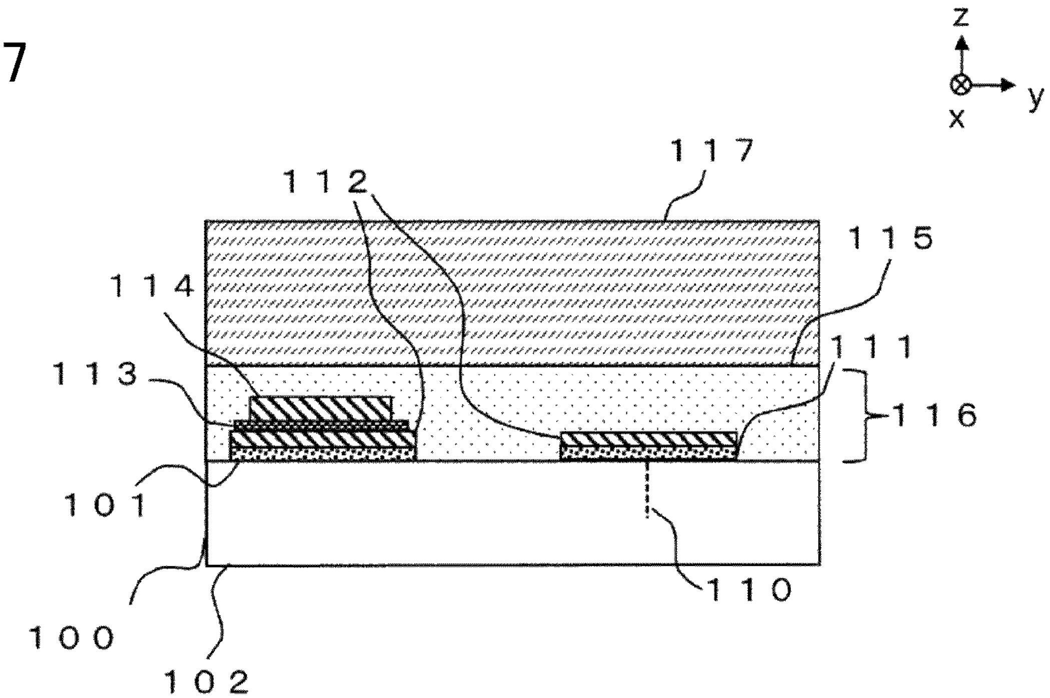
FIG. 17 is a diagram illustrating a step 8 of the manufacturing method according to the fifth embodiment.

FIG. 17 is a diagram illustrating a step 8 of the manufacturing method according to the fifth embodiment. In the step 8, a carrier 117 is bonded onto the first-surface wiring layer 116.

The carrier 117 is bonded onto the wiring layer formed on the first surface 101 via an adhesive (REVALPHA manufactured by Nitto Denko Corporation) for temporary adhesion. In the example of the first embodiment, the carrier 117 is a glass carrier. It is desirable that the thickness of the glass carrier range from 0.7 mm or more and 1.5 mm or less in view of the conveyance after thinning described below. It is possible to select the thickness of the carrier 117 as appropriate depending on the thickness of the glass substrate 100. In addition, the carrier 117 is a supporting body and a glass carrier is used as an example. The supporting body is not, however, limited to a glass supporting body. A metal or resin supporting body may be used.

Step 9

Figure 18:
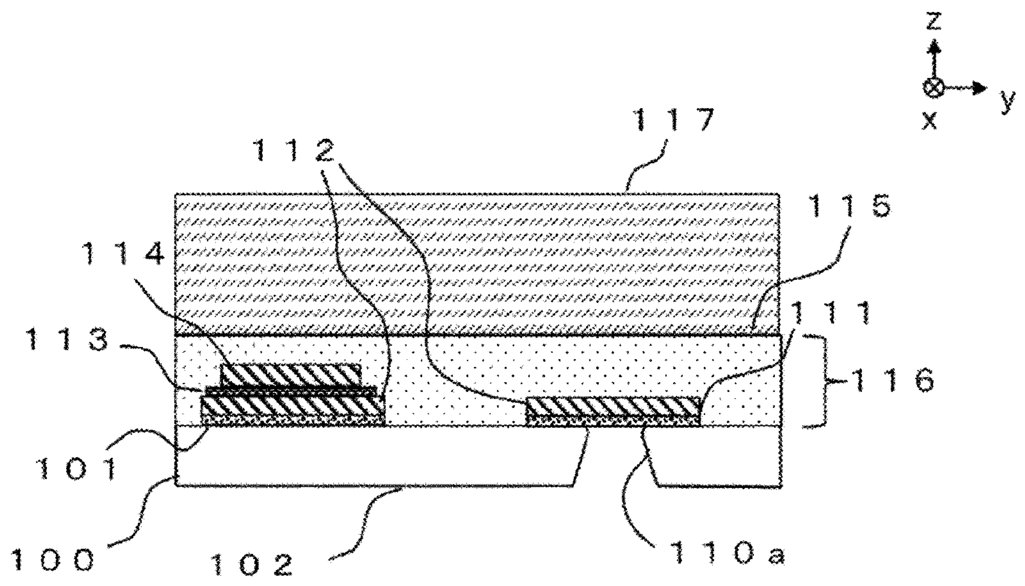
FIG. 18 is a diagram illustrating a step 9 of the manufacturing method according to the fifth embodiment.

FIG. 18 is a diagram illustrating a step 9 of the manufacturing method according to the fifth embodiment. In the step 9, etching is performed by using a hydrogen fluoride solution from the second surface 102 side that is the surface opposed to the first surface 101.

In a case where the hydrogen fluoride solution comes into contact with the laser modified portion 110 of the glass substrate 100, etching proceeds more in the laser modified portion than in a portion on the second surface 102 that is not modified and a through hole 110*a* is formed. The portion on the glass substrate 100 at which the laser modified portion 110 is not formed is etched and thinned by the hydrogen fluoride solution in the direction parallel with the second surface 102. In this way, the glass substrate 100 decreases in thickness and is thinned as the through hole 110*a* is formed. That is, the glass substrate is thinned and the through hole is formed in a series of etching processes. The lower surface of the thinned glass substrate serves as a second surface on which a second-surface wiring layer is formed.

Additionally, it is possible to set an etching amount achieved by the hydrogen fluoride solution as appropriate depending on the thickness of the glass device. For example, in a case where the thickness of the glass substrate used in the step 1 is 500 μm, it is desirable that the etching amount thereof be greater than or equal to 100 μm and less than or equal to 450 μm. In addition, it is desirable that the thickness of the thinned glass substrate be greater than or equal to 50 μm and less than or equal to 300 μm.

Here, the control over the etching conditions makes it possible to obtain the shape at the minimum point illustrated in FIG. 1. Selecting the concentration, the time, and the etching method of spraying or dipping as appropriate as the control method offers a desired shape.

In addition, for example, as the description of the control conditions, it is also possible to cause the seed layer 111 to function as an etching stopper layer, subject the second surface 102 to wet etching, and form a side-etching region having a tapered shape at the interface between the etching stopper layer and the glass substrate 100 by continuing etching for 20 minutes or more after the etching reaches the etching stopper layer.

A hydrogen fluoride aqueous solution to be used for the etching is a mixture etchant including at least one or more of hydrogen fluoride, hydrochloric acid, sulfuric acid, nitric acid, acetic acid, citric acid, and oxalic acid. It is desirable to set the composition of the etching hydrogen fluoride aqueous solution. In particular, it is desirable to set the hydrogen fluoride concentration. To achieve the ranges described above, it is desirable that the hydrogen fluoride concentration be greater than or equal to 1.0 wt % and less than or equal to 20.0 wt %. It is more desirable that the hydrogen fluoride concentration be greater than or equal to 1.0 wt % and less than or equal to 6.0 wt %.

It is desirable to set the hydrogen fluoride solution at the concentration described above and set an etching rate of 1.0 μm/min or less. It is desirable that the temperature of the etchant during the etching be greater than or equal to 10° C. and less than or equal to 40° C.

Step 10

Figure 19:
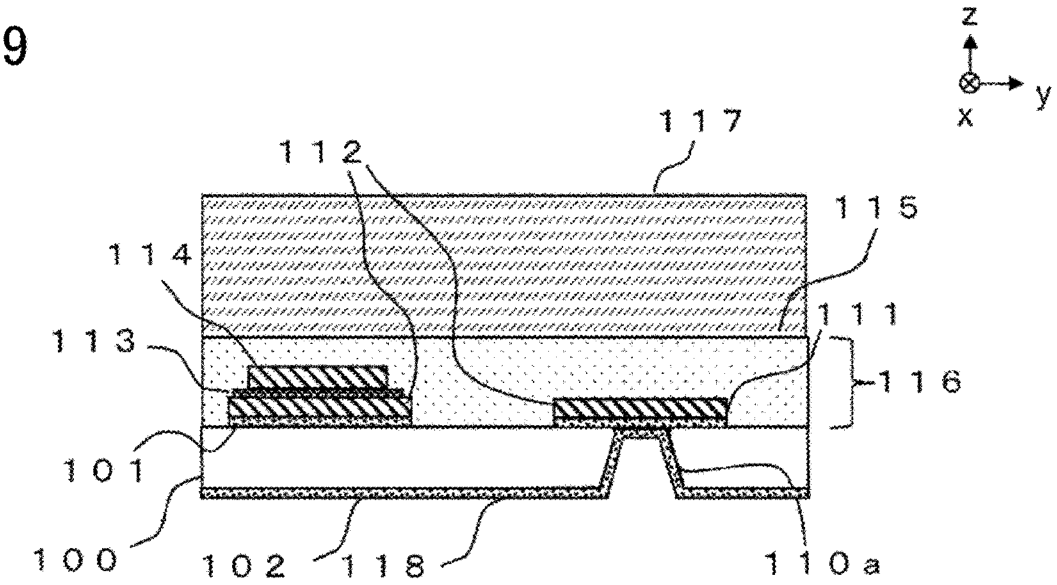
FIG. 19 is a diagram illustrating a step 10 of the manufacturing method according to the fifth embodiment.

FIG. 19 is a diagram illustrating a step 10 of the manufacturing method according to the fifth embodiment. In the step 10, a copper coating or an equivalent thereto is formed on the second surface 102 of the glass substrate in a sputtering method, an electroless plating method, and the like. The thickness is, for example, greater than or equal to 100 nm and less than or equal to 500 nm. This forms a seed layer 118 on the second surface 102 of the glass substrate. The seed layer 118 is also formed on the inner wall surface of the through hole 110*a*.

Step 11

Figure 20:
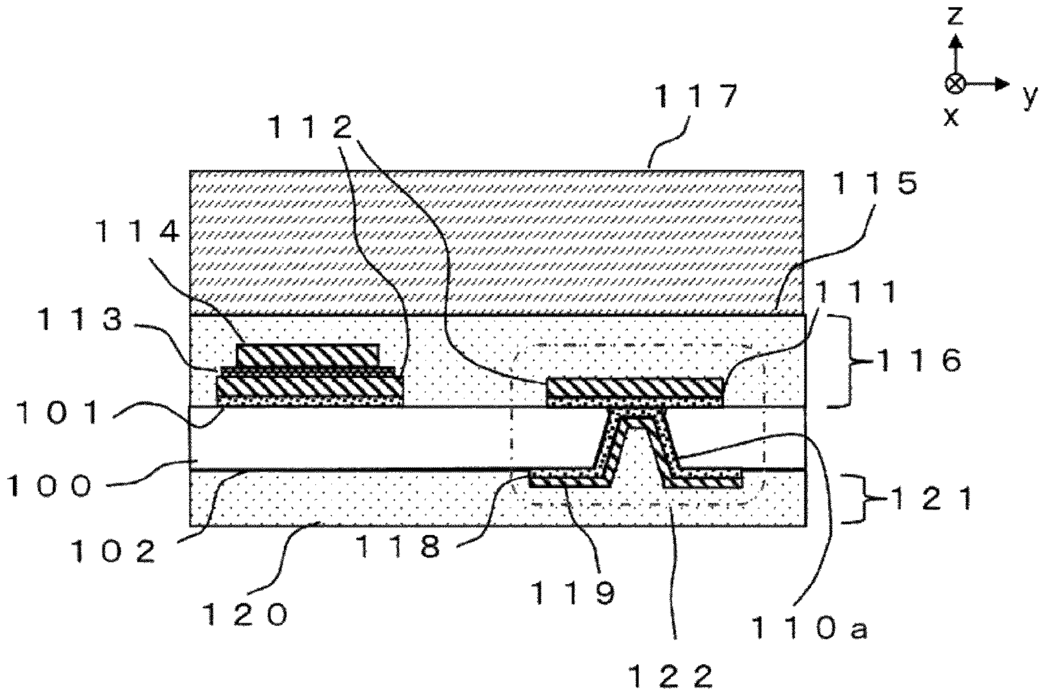
FIG. 20 is a diagram illustrating a step 11 of the manufacturing method according to the fifth embodiment.

FIG. 20 is a diagram illustrating a step 11 of the manufacturing method according to the fifth embodiment. In the step 11, a wiring layer is formed.

Here, as in the step 3, a pattern is formed by using a dry film resist, the seed layer is supplied with power, and electroplating of a thickness of 2 μm or more and 10 μm or less is carried out. After that, dry film resist that is no longer necessary is dissolved away. An electrode 119 formed in this way is conducted to the lower electrode 112. In this way, the seed layer 111, the lower electrode 112, and the seed layer 118 formed in the through hole 110*a* are formed as a through electrode 122 that penetrates the glass substrate 100. After that, the seed layer 118 that is no longer necessary is removed or an outer layer protective film 120 of an insulating resin, a solder resist, or the like is used for coating to form a second-surface wiring layer 121. In this way, the multi-layer wiring substrate according to the fifth embodiment is formed.

Figure 21A:
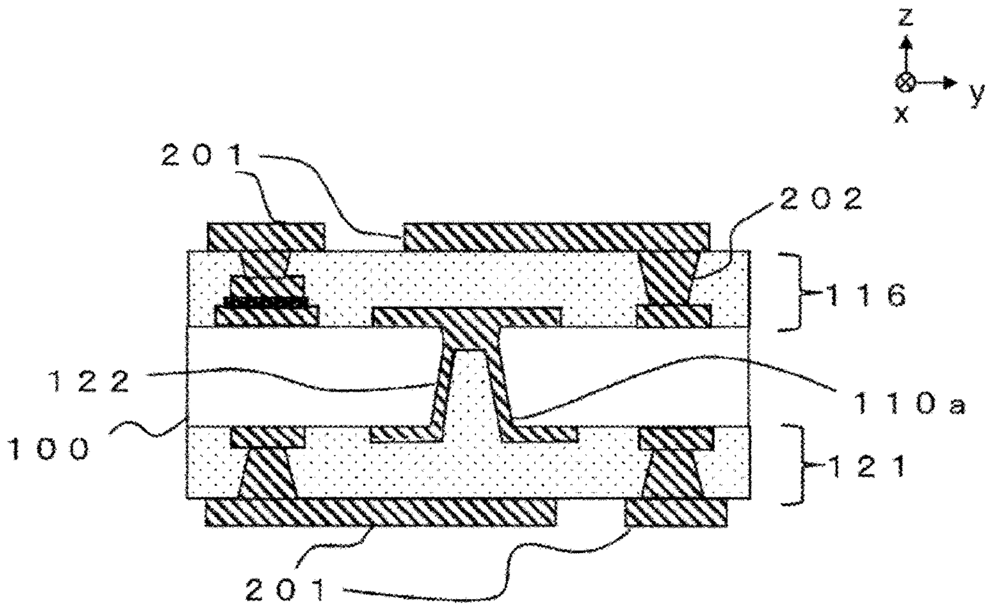
FIGS. 21A and 21B are diagrams illustrating a step 12 of the manufacturing method according to the fifth embodiment.
Figure 21B:
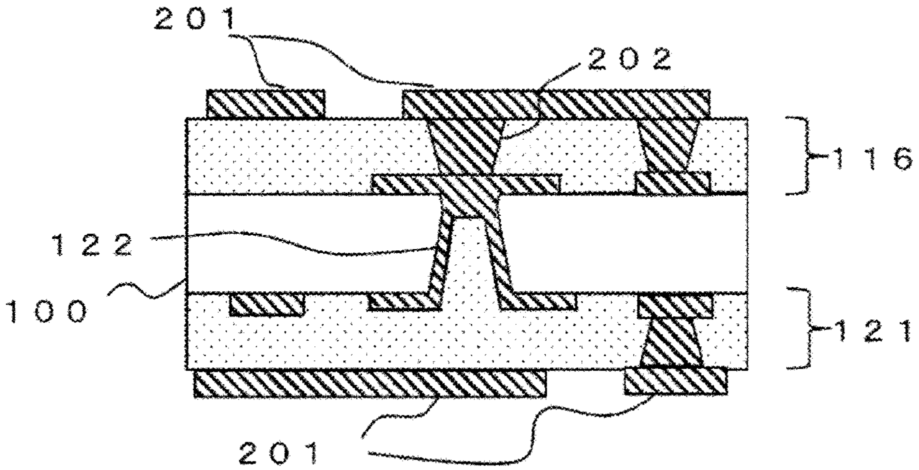

FIGS. 21A and 21B illustrate a step 12 of the manufacturing method according to the fifth embodiment. As illustrated in FIG. 21A, the carrier 117 bonded in the step 8 is detached in the step 12. Wiring lines 201 on the front and back surfaces are then formed, for example, as with an FC-BGA substrate.

Additionally, it is also possible to form a via 202 in the wiring layer immediately above the through electrode 122 as illustrated in FIG. 21B. This is because it is possible to form the via 202 on the electrode surface of the through electrode 122. When the via is formed, it is necessary to perform laser processing on the resin layer covering the through electrode. In the case of the through electrode 122, it is possible to release stress near the through hole 110*a* resulting from thermal strain caused by the laser processing at the time of the formation of the via and obtain a substrate with high reliability. It is to be noted that the through electrode 122 is not limited to the through electrode described in the first embodiment. It is also possible to apply the through electrodes described in the second embodiment to the fourth embodiment as long as they are bottomed through electrodes.

The manufacturing method according to the fifth embodiment has been described above. It is to be noted that an inductor (coil) may be formed in a step of forming a wiring line. It is possible to select the solenoid shape and the spiral shape as the shape of the inductor. In addition, the method for forming a through hole with a laser beam has been described, but the formation of a through hole may be achieved by using a variety of methods such as a mechanical processing method, plasma etching, and dry etching.

Sixth Embodiment

A sixth embodiment is different from the fifth embodiment in that the inside of a through electrode is filled with a conductive member. The case of a so-called conformal form has been described in each of the first embodiment to the fifth embodiment where the inside of the through electrode is not filled with a conductive member. The case of a so-called filled form will be described in the sixth embodiment where the inside of a through electrode is filled with a conductive member.

Figure 22A:
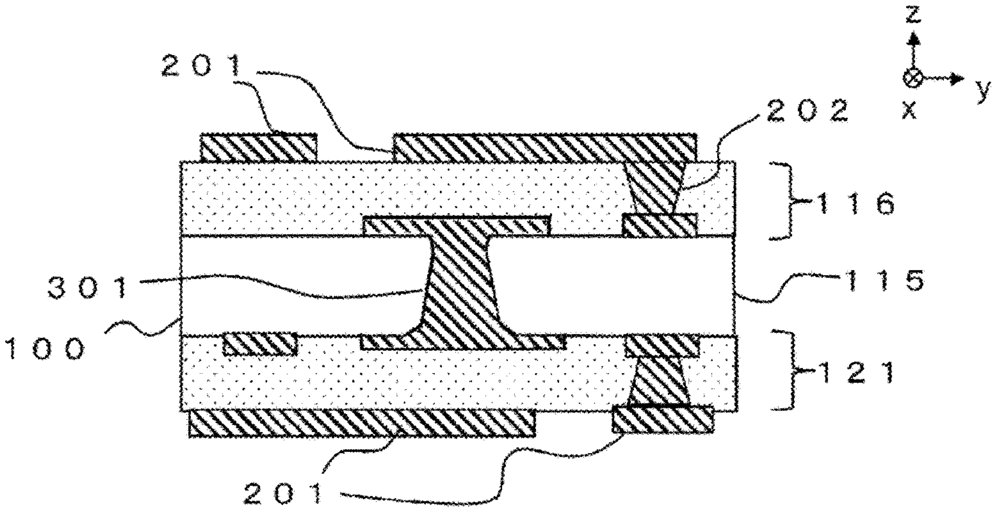
FIGS. 22A-22C are diagrams schematically illustrating a cross section of a glass substrate, a through electrode, and a multi-layer wiring substrate according to a sixth embodiment.
Figure 22B:
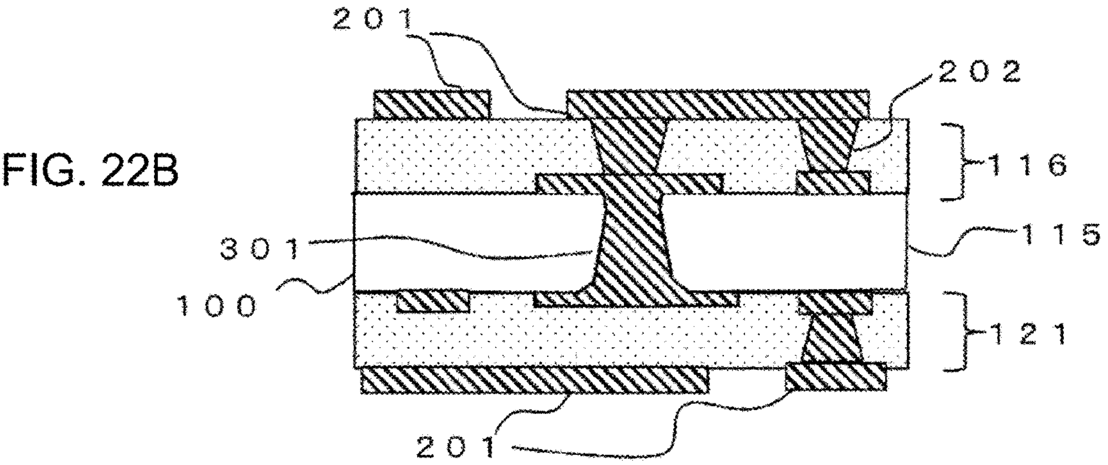
Figure 22C:
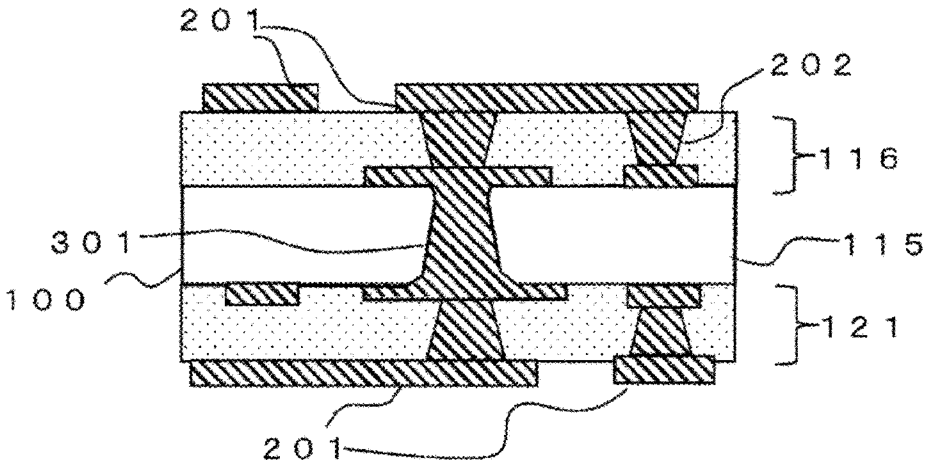

FIGS. 22A-22C are diagrams schematically illustrating a cross section of a glass substrate, a through electrode, and a multi-layer wiring substrate according to the sixth embodiment.

FIG. 22A illustrates a case where a through electrode 301 is filled with a conductive member. Meanwhile, in FIG. 22B, the via 202 of the first-surface wiring layer 116 is formed immediately above the through electrode 301. In addition, as illustrated in FIG. 22C, not only the via is formed immediately above the through electrode 301, but a via of the second-surface wiring layer 121 is also formed immediately below the through electrode 301.

Functions and Effects

Cu has an elastic modulus of 130 Gpa and resin has an elastic modulus of about 5 Gpa to 20 Gpa. Cu has a greater elastic modulus than that of resin. The glass may thus have a greater load in a case where the inside of the through electrode is filled with Cu. The entire through electrode is then filled with Cu as illustrated in FIGS. 22A-22C, thereby making it possible to provide a substrate with high reliability. It is to be noted that subjecting through holes to filled-plating makes it possible to form vias immediately above the through holes on one or both of the surfaces, but stress near the through holes resulting from thermal strain caused by laser processing at the time of the formation of the vias is also released in both configurations as with conformal plating.

Reliability Test

Table 1 illustrates results of reliability tests. Example 1 to Example 8 are LC circuit substrates to which the structure of FIG. 20 is applied and are created under the conditions of the fifth embodiment. Comparative Examples 1 to 4 are LC circuit substrates to which another structure is applied.

The column "folding position" in Table 1 is Tm illustrated in FIGS. 3A and 3B. "Chamfering" is the presence or absence of the chamfered shape 330 according to the fourth embodiment. "Plating thickness Tv<Tm" indicates whether a through electrode is filled with Cu plating in the lower direction of the minimum point. "Possibility of Metallization" is determined by observing the external appearance of a through electrode.

The conditions of the reliability tests are as follows.

Setting conditions: a lower limit temperature of −40° C. for 30 minutes and an upper limit temperature of 150° C. for 30 minutes.

Testing device TSA-43EL (manufactured by ESPEC)

Measuring an increase in the resistance of a wiring path including a through electrode for each number of cycles.

Unsatisfaction criterion: determined as unsatisfactory in a case where the resistance value after a cycle exceeds a value that is ten times as great as the initial resistance value.

Comparative Example 3 indicates that metallization is impossible. It is indicated that the angle of the folding position influences the formation of plating.

When Example 7 and Example 5 are compared, the reliability of Example 7 is higher. An effect of the chamfered shape on the second surface 102 side is indicated.

When Example 5 and Comparative Example 4 are compared, the reliability of Example 5 is higher. It is indicated that the structure in FIG. 20 has high reliability.

When Example 8 and Example 7 are compared, the reliability of Example 8 is higher. The reliability of the structure in which a through electrode is filled with Cu is indicated.

In this way, it is confirmed through the reliability tests that the multi-layer wiring substrate according to the invention of this application is secured reliability.

The embodiments of the present invention have been described above, but the present invention is not limited to the embodiments described above. It is possible to make a variety of changes with the scope that does not deviate from the gist of the present invention.

Reference Signs List 100: Glass substrate; 101: First surface; 102: Second surface; 103, 110*a*: Through hole; 105: Minimum point; 106, 106*a*, 106*b*, 106*c*, 106*d*: Through electrode; 110: Laser modified portion; 111: Seed layer; 112: Lower electrode; 113: Dielectric film; 114: Upper electrode; 115: Insulating resin; 116: First-surface wiring layer; 117: Carrier; 118: Seed layer; 119: Electrode; 120: Outer layer protective film; 121: Second-surface wiring layer; 122, 301: Through electrode; 300: Glass substrate; 330, 1065*d*: Chamfered shape; 1061*a*, 1061*b*, 1061*c*, 1061*d*: First-surface-side electrode; 1062*a*, 1062*b*, 1062*c*, 1062*d*: Second-surface-side electrode; 1063*a*, 1063*b*, 1063*c*, 1063*d*: Cavity portion; 1064*a*, 1064*b*, 1064*c*, 1064*d*: Electrode outer wall portion.

TABLE 1

| | shape | | | | | | evaluation result temperature cycle (cycle) | | | | | | | |
|---|---|---|---|---|---|---|---|---|---|---|---|---|---|---|
| | folded structure | folding position | angle | chamfering | plating thickness Tv < Tm | Possibility of Metallization | 250 | 500 | 750 | 1000 | 1250 | 1500 | 1750 | 2000 |
| Ex. 1 | Yes | Ts/110 | 110 | No | No | possible | OK | OK | OK | OK | unsatisfactory | — | — | — |
| Ex. 2 | Yes | Ts/20 | 110 | No | No | possible | OK | OK | OK | OK | OK | unsatisfactory | — | — |
| Ex. 3 | Yes | Ts/10 | 110 | No | No | possible | OK | OK | OK | OK | OK | unsatisfactory | — | — |
| Ex. 4 | Yes | Ts/100 | 110 | No | No | possible | OK | OK | OK | OK | OK | unsatisfactory | — | — |
| Ex. 5 | Yes | Ts/20 | 25 | No | No | possible | OK | OK | OK | OK | OK | OK | unsatisfactory | — |
| Ex. 6 | Yes | Ts/20 | 85 | Yes | No | possible | OK | OK | OK | OK | OK | OK | unsatisfactory | — |
| Ex. 7 | Yes | Ts/20 | 25 | Yes | No | possible | OK | OK | OK | OK | OK | OK | OK | unsatisfactory |
| Ex. 8 | Yes | Ts/20 | 25 | No | Yes | possible | OK | OK | OK | OK | OK | OK | OK | OK |
| Comp. Ex. 1 | Yes | No | — | No | No | possible | OK | OK | unsatisfactory | — | — | — | — | — |
| Comp. Ex. 2 | Yes | Ts/9 | 110 | No | No | impossible | — | — | — | — | — | — | — | — |
| Comp. Ex. 3 | Yes | Ts/20 | 10 | No | No | impossible | — | — | — | — | — | — | — | — |
| Comp. Ex. 4 | No | No | — | No | — | possible | OK | unsatisfactory | — | — | — | — | — | — |

When Example 1 and Comparative Example 1 are compared, the reliability of Example 1 is higher. It is indicated that a glass substrate according to the present invention has high reliability.

When Examples 2, 3, and 4 and Example 1 are compared, the reliability of each of Examples 2, 3, and 4 is higher. This indicates that the folding position, that is, the position of the minimum point of a glass substrate according to the present invention contributes to an increase in reliability.

Comparative Example 2 indicates that metallization is impossible. It is indicated that the folding position influences the formation of plating.

When Example 5, Example 6, and Example 2 are compared, the reliability of each of Examples 5 and 6 is higher. It is indicated that the angle of a folded shape contributes to an increase in reliability.

What is claimed is:

1. A glass substrate, comprising a through hole that penetrates the glass substrate from a first surface to a second surface, wherein the through hole has a minimum bore diameter in the through hole in a section of 1% to 10% from the first surface in a section from the first surface to the second surface, wherein the through hole has a chamfered shape on the second surface side, and when a point at which an inner wall surface between the minimum point and the chamfered shape crosses an aperture of the second surface is defined as a crossing point and a point at which the chamfered shape reaches the second surface is defined as a terminal point in the cross section of the through hole including the center axis of the through hole, a distance between the crossing point and the terminal point is greater than or equal to 1um and less than or equal to 20 μm.

2. The glass substrate of claim 1, wherein in a case where a virtual straight line that is parallel with the first surface and passes through a point, referred hereinafter as a minimum point, at which the through hole has the minimum bore diameter is defined and a tangent line that comes into contact with an inner wall surface of the through hole is drawn from the virtual straight line in a cross section including a center axis of the through hole, an angle formed by the virtual straight line and the tangent line of the inner wall surface ranges from 0° to 90° in an upper direction of the minimum point, and the angle formed by the virtual straight line and the tangent line of the inner wall surface ranges from 0° to −90° in a lower direction of the minimum point.

3. The glass substrate of claim 1, wherein the tangent line of the inner wall surface is obtained on a basis of a regression line derived by using a least-squares method for any three points set on the inner wall surface of the through hole.

4. The glass substrate of claim 1, wherein the distance between the crossing point and the terminal point is greater than or equal to 5 μm and less than or equal to 10 μm.

5. The glass substrate of claim 1, wherein a conductive member is formed on the inner wall surface of the through hole, and the conductive member covers an aperture of the first surface.

6. The glass substrate of claim 5, wherein a region from the aperture of the first surface to a region in the lower direction of the minimum point of the through hole is filled with the conductive member.

7. A multi-layer wiring substrate, wherein a wiring layer is formed on the first surface or the second surface of the glass substrate of claim 1.

8. A through electrode that is formed in a glass substrate including a through hole that penetrates the glass substrate from a first surface to a second surface, wherein the through electrode has a first tapered shape in which a bore diameter grows larger from a minimum point in a section of 10% from the first surface to the first surface, and a second tapered shape in which the bore diameter grows larger from the minimum point to an aperture of the second surface in a section from the first surface to the second surface in a cross section including a center axis of the through hole, wherein the through hole has a chamfered shape on the second surface side, and when a point at which an inner wall surface between the minimum point and the chamfered shape crosses an aperture of the second surface is defined as a crossing point and a point at which the chamfered shape reaches the second surface is defined as a terminal point in the cross section of the through hole including the center axis of the through hole, a distance between the crossing point and the terminal point is greater than or equal to 1 μm and less than or equal to 20 μm.

9. A method for manufacturing a glass substrate of claim 1 having a first surface and a second surface, comprising the steps of: a first step of preparing the glass substrate; a second step of irradiating the first surface with a laser beam to form a modified portion from which a through hole originates in the glass substrate; a third step of forming an etching stopper layer on the first surface; and a fourth step of subjecting the second surface to wet etching, wherein after etching reaches the etching stopper layer, the etching is continued for 20 minutes or more to form a side-etching region having a tapered shape at an interface between the etching stopper layer and the glass substrate.

* * * * *